(12) United States Patent
Greco et al.

(10) Patent No.: US 9,454,631 B2
(45) Date of Patent: Sep. 27, 2016

(54) STITCH-DERIVED VIA STRUCTURES AND METHODS OF GENERATING THE SAME

(71) Applicant: International Business Machines Corporation, Armonk, NY (US)

(72) Inventors: Stephen E. Greco, Lagrangeville, NY (US); Vincent J. McGahay, Poughkeepsie, NY (US); Rasit O. Topaloglu, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 190 days.

(21) Appl. No.: 14/285,719

(22) Filed: May 23, 2014

(65) Prior Publication Data

US 2015/0339422 A1    Nov. 26, 2015

(51) Int. Cl.
| | | |
|---|---|---|
| *G06F 17/50* | (2006.01) | |
| *H01L 21/311* | (2006.01) | |
| *H01L 21/033* | (2006.01) | |
| *H01L 23/522* | (2006.01) | |
| *H01L 21/768* | (2006.01) | |

(52) U.S. Cl.
CPC ......... *G06F 17/5068* (2013.01); *G06F 17/50* (2013.01); *H01L 21/033* (2013.01); *H01L 21/0332* (2013.01); *H01L 21/311* (2013.01); *H01L 21/31111* (2013.01); *H01L 21/31144* (2013.01); *H01L 21/76811* (2013.01); *H01L 21/76813* (2013.01); *H01L 21/76816* (2013.01); *H01L 23/522* (2013.01); *H01L 2924/0002* (2013.01)

(58) Field of Classification Search
USPC .......................................................... 716/55
See application file for complete search history.

(56) References Cited

U.S. PATENT DOCUMENTS

| | | | |
|---|---|---|---|
| 6,664,011 | B2 | 12/2003 | Lin et al. |
| 6,883,158 | B1 | 4/2005 | Sandstrom et al. |
| 7,224,030 | B2 | 5/2007 | Schroeder |
| 7,410,736 | B2 | 8/2008 | Bleeker et al. |
| 7,444,616 | B2 | 10/2008 | Sandstrom et al. |
| 7,927,928 | B2 | 4/2011 | Pierrat |
| 8,575,664 | B2 | 11/2013 | Rothberg et al. |
| 8,598,632 | B2 | 12/2013 | Tran et al. |
| 8,601,407 | B2 | 12/2013 | Wang et al. |

(Continued)

OTHER PUBLICATIONS

List of IBM Patents or Patent Applications Treated as Related.

*Primary Examiner* — Mohammed Alam
(74) *Attorney, Agent, or Firm* — Scully, Scott, Murphy & Presser, P.C.; Steven J. Meyers

(57) ABSTRACT

Via-level design shapes are mapped into stitch regions of line-level design shapes design in an overlying conductive line level. A via-catching design shape is provided in an underlying conductive line level for each stitch region that does not correspond to a via-level design shape. The shapes of the stitch regions and the via-catch design shapes can be adjusted to comply with design rule constraints. Further, stitches can be optionally moved into a neighboring line-level design shape to resolve design rule conflicts. The modified design layout can eliminate via-level design shapes once all via-level design shapes are replaced with a corresponding stitch region, thereby eliminating the need to provide a via level lithographic mask. A metal interconnect structure embodying the modified design layout can be formed by employing a set of hard mask layers and without employing a lithographic mask for a via level.

20 Claims, 17 Drawing Sheets

(56) References Cited

U.S. PATENT DOCUMENTS

| | | |
|---|---|---|
| 8,605,249 B2 | 12/2013 | Inoue et al. |
| 8,610,093 B2 | 12/2013 | Kruit |
| 8,610,986 B2 | 12/2013 | Jain et al. |
| 8,627,244 B2 | 1/2014 | Agarwal et al. |
| 8,629,064 B2 | 1/2014 | Li et al. |
| 8,629,389 B2 | 1/2014 | Barrows |
| 8,630,322 B2 | 1/2014 | Dantus et al. |
| 8,631,373 B1 | 1/2014 | Gennari et al. |
| 8,631,379 B2 | 1/2014 | Chen et al. |
| 8,631,381 B2 | 1/2014 | Dai et al. |
| 2004/0268289 A1 | 12/2004 | Sandstrom et al. |
| 2009/0104549 A1 | 4/2009 | Sandstrom et al. |
| 2013/0174106 A1* | 7/2013 | Hsu .................. G06F 17/50 716/55 |
| 2013/0198696 A1* | 8/2013 | Wang ................. G06F 17/5081 716/51 |
| 2013/0280813 A1 | 10/2013 | Rothberg et al. |
| 2013/0292743 A1 | 11/2013 | Rothberg et al. |
| 2013/0324421 A1 | 12/2013 | Rothberg et al. |
| 2013/0338046 A1 | 12/2013 | Rothberg et al. |
| 2014/0005555 A1 | 1/2014 | Tesar |
| 2014/0011204 A1 | 1/2014 | Unger et al. |
| 2014/0013361 A1 | 1/2014 | Monari et al. |
| 2014/0145342 A1* | 5/2014 | Schultz ............ H01L 21/31144 257/773 |
| 2015/0227666 A1* | 8/2015 | Seo .................... G06F 17/5081 716/53 |
| 2015/0332996 A1* | 11/2015 | Kuo ................. H01L 23/49838 257/676 |

* cited by examiner

STITCH-DERIVED VIA STRUCTURES AND METHODS OF GENERATING THE SAME

BACKGROUND

The present disclosure relates generally to a method of generating a design layout including design shapes that confine stitch-induced via structures above an underlying conductive line level, a system for implementing the same, and a method of forming a metal interconnect structure embodying such a design layout.

Printing a lithographic pattern having pitches below lithographic limits of traditional lithographic techniques results in degradation of the fidelity of the printed pattern. To overcome this problem, a multi-exposure technique in which multiple lithographic exposures are performed for a single level, can be employed. In order to implement the multi-exposure technique, a given design shape in a design level may be decomposed into multiple decomposed design shapes. The multiple decomposed design shapes are assigned to different lithographic masks that correspond to different "colors" that collectively constitute the design level. The process of decomposing design shapes into groups of decomposed design shapes corresponding to different colors is referred to as "coloring."

A design shape in a design level can thus includes multiple decomposed shapes corresponding to different colors. The number of colors corresponds to the number of lithographic masks to be employed to print the lithographic pattern corresponding to the design shapes in the design level. Each lithographic mask includes decomposed design shapes of the same color. Each lithographic exposure adds the pattern corresponding to decomposed design shapes of a corresponding color to a hard mask layer. If performed correctly, the multiple lithographic exposures add the patterns of the decomposed design shapes of all the colors of the design level to generate the pattern of the original design shape in the design level.

To ensure that the multiple lithographic exposures result in replication of the original pattern despite overlay variations and variations in other lithographic parameters, generation of areas of overlap are built into the decomposition process. The process of generation of areas of overlap between design shapes having different colors and derived from decomposition of an original design shape in the given design level is referred to as "stitching." An area of overlap between design shapes having different colors is referred to as a "stitch," a "stitch region," or a "stitching area."

Lithographic pattern transfer is implemented by transferring a pattern in a photoresist layer into a material layer by an etch process. Stitches correspond to regions in which multiple etch processes are performed in a same material layer. Thus, a region in a physical structure corresponding to a stitch are prone to be etched through due to multiple etch processes performed therein if sufficient process variations occur in the deposition of the material layer prior to lithographic processes or during the etch processes. If a region corresponding to a stitch is etched through unintentionally, a via structure is collaterally formed during a via etch process when a via structure should not be formed. Formation of such a collateral via structure can create electrical shorts in a metal interconnect structure among components that should be electrically isolated. Further, such a collateral via can be narrow and prevent deposition of a diffusion barrier layer at a thickness sufficient to prevent diffusion of metals (e.g., copper). In that case, metal can diffuse through thin portions of the diffusion barrier layer and diffuse into dielectric materials embedding metal interconnect structures or into semiconductor materials in a semiconductor substrate including semiconductor devices and cause reliability issues. In order to avoid such deleterious effects, it is in general desirable to prevent or minimize formation of collateral via structures.

SUMMARY

Via-level design shapes are mapped into stitch regions of line-level design shapes design in an overlying conductive line level. A via-catching design shape is provided in an underlying conductive line level for each stitch region that does not correspond to a via-level design shape. The shapes of the stitch regions and the via-catch design shapes can be adjusted to comply with design rule constraints. Further, stitches can be optionally moved into a neighboring line-level design shape to resolve design rule conflicts. The modified design layout can eliminate via-level design shapes once all via-level design shapes are replaced with a corresponding stitch region, thereby eliminating the need to provide a via level lithographic mask. A metal interconnect structure embodying the modified design layout can be formed by employing a set of hard mask layers that replicates the pattern of the stitch regions in a lower hard mask while replicating non-stitch shaped in an upper hard mask. A dual damascene cavity can be formed by an anisotropic etch without employing a lithographic mask including a pattern for a via level.

According to an aspect of the present disclosure, a method for generating shapes for a design layout is provided. A design layout is provided, which includes a conductive line level, an underlying conductive line level, and a via design level. The conductive line level includes conductive-line-level design shapes that represent conductive line structures in a conductive line level in a target interconnect structure. The underlying conductive line level includes underlying-conductive-line-level design shapes that represent underlying conductive line structures in an underlying conductive line level located underneath the conductive line level in the target interconnect structure. The via design level includes via-level design shapes that represent via structures that vertically interconnect the conductive line structures and the underlying conductive line structures. The conductive-line-level design shapes include a plurality of decomposed design shapes having different colors that correspond to a different lithographic mask. The method further includes modifying, for a conductive-line-level design shape that overlaps with the via-level design shapes, decomposed design shapes corresponding to the conductive-line-level design shape such that each via overlap region in which the conductive-line-level design shape overlaps with the via-level design shapes is transformed into a stitch region in which two decomposed design shapes overlap each other by running an automated program on a computer configured to run the automated program.

According to another aspect of the present disclosure, a method of forming a metal interconnect structure is provided. A dielectric material layer and a stack of hard mask layers are formed over an underlying dielectric material layer embedding underlying conductive line structures. The stack of hard mask layers includes at least, from bottom to top, a first dielectric hard mask layer including a first dielectric material, a second dielectric hard mask layer including a second dielectric material, a metallic hard mask layer including a metallic material, and a third dielectric hard mask layer including a third dielectric material. A first portion of the third dielectric hard mask layer and the metallic hard mask layer are recessed within an area of a first pattern employing a combination of a first lithographic process and a first etch. A second portion of the third dielectric hard mask layer and the metallic hard mask layer are recessed within an area of a second pattern employing a combination of a second lithographic process and a second etch. A cavity is formed within an area of intersection between the first pattern and the second pattern. The cavity has a bottom surface below a first horizontal plane including a bottom surface of the second dielectric hard mask layer and above a second horizontal plane including a top surface of the dielectric material layer. A continuous recessed space including a line trench and a via cavity is formed by further recessing regions of the first and second pattern. The via cavity is formed within an area of one of the underlying conductive line structures.

According to yet another aspect of the present disclosure, an apparatus for generating shapes for a design layout is provided. The apparatus includes a particularly programmed computer including one or more processors in communication with a memory and configured to run an automated program. The automated program includes a step of receiving a design layout including a conductive line level, an underlying conductive line level, and a via design level. The conductive line level includes conductive-line-level design shapes that represent conductive line structures in a conductive line level in a target interconnect structure. The underlying conductive line level includes underlying-conductive-line-level design shapes that represent underlying conductive line structures in an underlying conductive line level located underneath the conductive line level in the target interconnect structure. The via design level includes via-level design shapes that represent via structures that vertically interconnect the conductive line structures and the underlying conductive line structures. The conductive-line-level design shapes include a plurality of decomposed design shapes having different colors that each correspond to a different lithographic mask. The automated program further includes a step of modifying, for a conductive-line-level design shape that overlaps with the via-level design shapes, decomposed design shapes corresponding to the conductive-line-level design shape such that each via overlap region in which the conductive-line-level design shape overlaps with the via-level design shapes is transformed into a stitch region in which two decomposed design shapes overlap each other.

DETAILED DESCRIPTION

Figure 1:
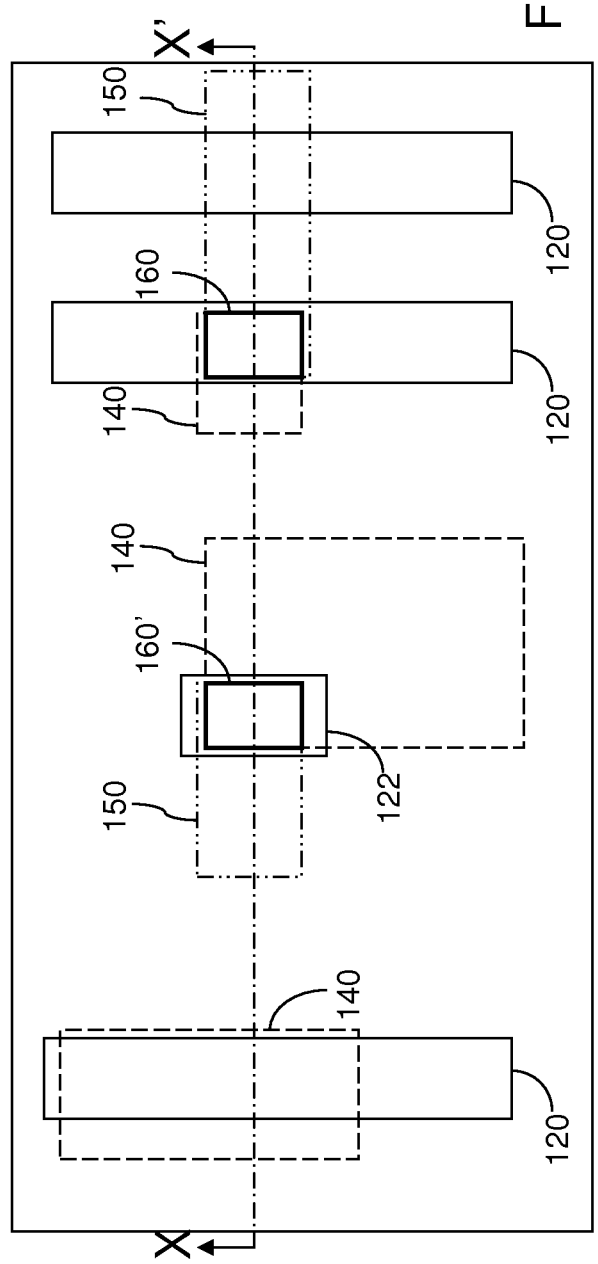
FIG. 1 is a plan view of an exemplary design layout including a stitch shape generated by replacement of a via-level design shape according to an embodiment of the present disclosure.

As stated above, the present disclosure relates to a method of generating a design layout including design shapes that confine stitch-induced via structures above an underlying conductive line level, a system for implementing the same, and a method of forming a metal interconnect structure embodying such a design layout. Aspects of the present disclosure are now described in detail with accompanying figures. It is noted that like and corresponding elements are referred to by like reference numerals. The drawings are not drawn to scale. Ordinals are used merely to distinguish among similar elements, and different ordinals may be employed across the specification and the claims of the instant application.

Referring to FIG. 1, an exemplary design layout is illustrated, which includes design shapes representing various conductive structures to be formed in a target interconnect structure. As used herein, a "design layout" refers to a collection of data that represents a geometrical relationship between various structural elements of conductive structures embedded in dielectric material layers that can be manufactured on a substrate. As used herein, a "design level" is a level within a design layout that includes geometrical shapes that are related, directly or indirectly, to a same set of processing steps for forming physical objects on a substrate. The geometrical shapes may be represented in a graphics format or in a non-graphics format. As used herein, a "mask level" is identical to a design level if mask decomposition is not employed, or is a subset of a design level corresponding to a same color if mask decomposition is employed in the design level. As used herein, an "interconnect structure" refers to a structure in which a plurality of conductive structures are embedded in at least one dielectric material layer to provide at least one conductive path. As used herein, a "target interconnect structure" is an ideal interconnect structure in which all structural and compositional parameters comply with a design layout therefor and process assumptions employed in a manufacturing process. As used herein, a "metal interconnect structure" refers to an interconnect structure in which metal structures are embedded as conductive structures. As used herein, a "line level structure" refers to a conductive structure that extends in a horizontal direction within a same level, i.e., between two horizontal planes separated by a thickness of the line level structure, of an interconnect structure. As used herein, a "line level" refers to a level including at least one line level structure. As used herein, a "via level structure" refers to a conductive structure that extends in a vertical direction between two different line levels. As used herein, a "via level" refers to a level between two vertically adjacent line levels. As used herein, an "overlying" level or an "overlying" structure refers to a level or a structure that is located above a level or a structure that is employed as a reference. As used herein, an "underlying" level or an "underlying" structure refers to a level or a structure that is located below a level or a structure that is employed as a reference. As used herein, an "immediately overlying" level refers to an overlying level below which no other overlying level exists for a reference level. As used herein, an "immediately underlying" level refers to an underlying level above which no other overlying level exists for a reference level.

Particularly, the exemplary design layout includes stitches in a line level at locations corresponding to locations of via structures in a target interconnect structure. The exemplary design layout does not include any design shape for a via design level, but the stitches in an immediately overlying line level represent the physical shapes of via structures to be formed for the corresponding via level in a target interconnect structure.

The exemplary design layout can be derived from an initial design layout that includes a conductive line level, an underlying conductive line level, and a via design level. The conductive line level is the immediately overlying level for the via design level, and underlying conductive line level is the immediately underlying level for the via design level. The conductive line level includes conductive-line-level design shapes that represent conductive line structures in a conductive line level in a target interconnect structure. The conductive line level is herein referred to as an M(x+1) line level, in which x is an integer that represents the order, from bottom to top, of the conductive line level within the interconnect structure. X can be any non-negative integer. In addition, if a local interconnect level including local interconnect structures as known in the art is employed underneath an M1 level, such a local interconnect level is herein referred to as an M0 level. If two local interconnect levels located at different levels are employed underneath an M1 level, a lower local interconnect level is herein referred to as an M(−1) level and an upper local interconnect level is herein referred to as an M0 level.

The conductive-line-level design shapes include a plurality of decomposed design shapes having different colors that correspond to different lithographic masks. Each set of design shapes of the same color collectively provide a pattern for a lithographic mask. The collection of all sets of design shapes for the conductive-line-level design shapes collectively provide the entirety of the patter for conductive line structures to be formed in the target interconnect structure. For example, the conductive-line-level design shapes can be M(x+1) line level design shapes. The M(x+1) line level design shapes can include M(x+1) line level design shapes having a first color and physically manifested as a first pattern in a first lithographic mask, and M(x+1) line level design shapes having a second color and physically manifested as a second pattern in a second lithographic mask.

The M(x+1) line level design shapes having the first color are herein referred to as first color M(x+1) line level design shapes 140, and the M(x+1) line level design shapes having the second color are herein referred to as second color M(x+1) line level design shapes 150. A stitch shape (160, 160') is a derived design shape that represents an intersection region in which M(x+1) line level design shapes of different colors, e.g., a first color M(x+1) line level design shape 140 and a second color M(x+1) line level design shape 150, overlap. A stitch shape can be a via-derived stitch 160 that substitutes a via-level design shape and is formed within an area of an underlying electrically-active Mx line level design shape 120 that functions as an electrically conductive path to another via structure and/or an electrically active node. Alternatively, a stitch shape can be a line-overlap-derived stitch 160' that is not derived from a via-level design shape, but merely represents an overlap of two colors in a line level design shape. A line-overlap-derived stitch 160' is formed within an area of an underlying via-catching design shape 122 that does not function as an electrically conductive path to another via structure and/or an electrically active node. As used herein, a "via-catching design shape" refers to a design shape that is present in a line level and within an area of an overlying via level structure in a target interconnect structure so that the overlying via level structure does not extend into a dielectric material of the line level. In this case, the underlying via-catching design shape 122 is employed solely for the purpose of preventing a physical via structure corresponding to the line-overlap-derived stitch 160' from extending below the top surface of an underlying dielectric material layer in a target interconnect structure, and is herein referred to as a via-catching shape, or a via-catching design shape.

While a small vertical offset is illustrated between overlapping pairs of a first color M(x+1) line level design shape 140 and a second color M(x+1) line level design shape 150, it is understood that the small vertical offset is illustrated to clearly delineate the boundaries of the stitches (160, 160'), and may, or may not, be present in the exemplary design layout. While the present disclosure is described employing two colors, variations of the present disclosure employing three or more colors for the conductive line level are expressly contemplated herein.

The underlying conductive line level of the design layout includes underlying-conductive-line-level design shapes that represent underlying conductive line structure in an underlying conductive line level located underneath the conductive line level in the target interconnect structure. The underlying conductive line level is a single line level that underlies the conductive line level, i.e., the M(x+1) line level. In one embodiment, the underlying conductive line level can be an Mx line level that is the underlying line level that underlies the M(x+1) line level and is most proximate to the M(x+1) line level.

The underlying-conductive-line-level design shapes may have the same color (i.e., does not use mask decomposition techniques), or may include a plurality of decomposed design shapes having different colors that correspond to different lithographic masks (i.e., use mask decomposition techniques). The underlying-conductive-line-level design shapes can be Mx line level design shapes (120, 122).

As used herein, a "stitch," a "stitch shape," or a "stitching area" is a shape in which a decomposed design shape having a shape and located within the conductive line level intersect with another decomposed design shape having a different color and located within the conductive line level. The stitch shapes are design shapes defined by the areal intersection of conductive-line-level design shapes having different colors, i.e., conductive-line-level design shapes assigned to different mask levels. For example, stitch shapes can include design shapes defined by the areal intersection of the first color M(x+1) line level design shapes and second color M(x+1) line level design shapes. Each stitch shape can be a polygon. In one embodiment, each stitch shape can be a rectangle.

For one of more of the stitch shapes present in the M(x+1) line level, a design shape in the underlying conductive line level, i.e., the Mx line level, occupies the entirety of the area of the one or more stitch shapes. For example, a via-catching design shape 122 can be a type of Mx-level design shapes (120, 122) that occupies the entirety of the area of the a stitch shape. The edges of the via-catching design shape 122 can be laterally and outwardly shifted relative to the edges of the stitch shape by a set of predetermined edge offset parameters. The set of predetermined edge offset parameters can include an x-axis overlay-based edge offset parameter $\Delta x$ and a y-axis overlay-based edge offset parameter $\Delta y$. The overlay-based edge offset parameters can be derived from the overlay tolerance for a lithographic process for patterning the conductive line structures (i.e., the M(x+1) line level conductive structures) relative to underlying conductive line structures in the underlying conductive line structures (i.e., the Mx line level conductive structures).

In one embodiment, an underlying conductive line structure that physically manifests the via-catching design shape 122 in the Mx line level in a target interconnect structure is electrically isolated from any other conductive structure except a collateral via structure that is connected to a conductive line structure in the M(x+1) line level that physically manifests the design shape in the M(x+1) line level that includes the area of the overlapping stitch shape.

As used herein, an "electrically isolated" element refers to an element that does not have any electrical connection with any other conductive structure. As such, a physical structure implementing an electrically isolated design shape is electrically floating, i.e., is not applied with any external voltage and does not serve as a current path. For example, an electrically isolated design shape can be a design shape representing a conductive fill portion employed to increase the pattern factor for conductive areas relative to the entire area of the interconnect structure. An electrically isolated design shape can represent a conductive line level structure that is designed to be electrically isolated from any other conductive line level structure or via level structure.

As used herein, an "electrically connected" element refers to an element that has an electrical connection with at least another conductive structure. As such, a physical structure implementing an electrically connected design shape is not electrically floating, and can be applied with any external voltage and serves as a current path. For example, an electrically connected design shape can be a design shape representing a metal line structure or a metal via structure.

In one embodiment, if the M(x+1) line level design shape that includes a stitch shape is an electrically isolated design shape, and the design shape in the Mx line level that overlaps the entirety of the via-catching design shape 122 does not introduce any electrical short to a corresponding physical Mx line level line structure in a target interconnect structure because a physical M(x+1) line level line structure implementing the M(x+1) line level design shape including the stitch shape is electrically isolated.

In one embodiment, if the M(x+1) line level design shape that includes a stitch shape is an electrically connected design shape, the design shape in the Mx line level that overlaps the entirety of the via-catching design shape 122 does not introduce any electrical short to a physical M(x+1) line level line structure implementing the M(x+1) line level design shape including the stitch shape in a target interconnect structure because a physical Mx line level line structure corresponding to the design shape in the Mx line level is electrically isolated.

At least one of the via-catching design shape 122 in the Mx line level and the M(x+1) line level design shape that includes the corresponding stitch is electrically isolated in the design layout. In one embodiment, the via-catching design shape 122 in the Mx line level that overlaps with the stitch shape is electrically isolated in the design layout. In another embodiment, the M(x+1) line level design shape that overlaps with a stitch shape is electrically isolated in the design layout. In yet another embodiment, both of the via-catching design shape 122 in the Mx line level and the M(x+1) line level design shape including the stitch shape are electrically isolated in the design layout.

Figure 2:
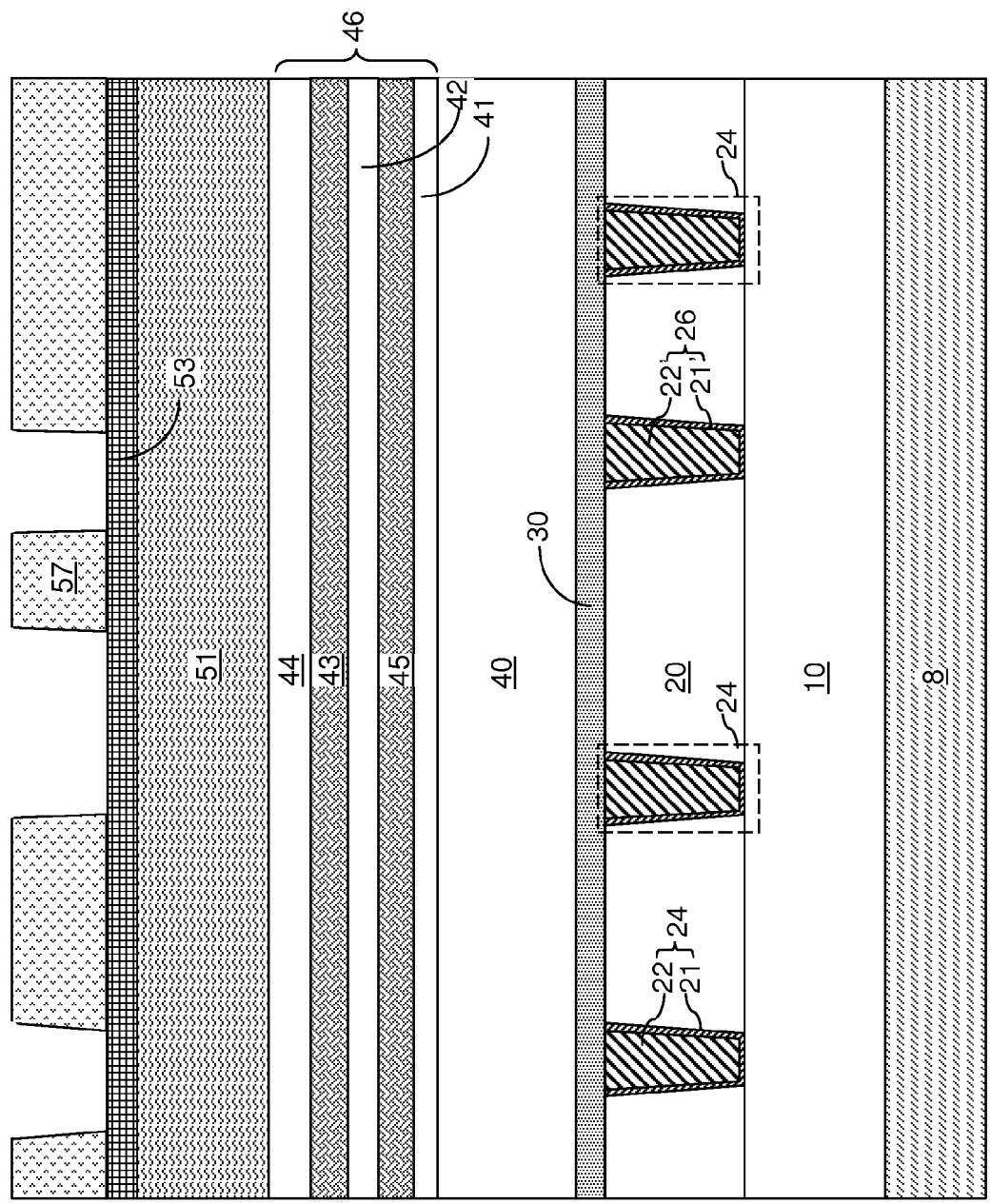
FIG. 2 is a vertical cross-sectional view of a first exemplary metal interconnect structure after formation of underlying conductive line level structures and lithographic patterning of a first photoresist layer with a first line pattern employing a first line level lithographic mask for a conductive line level according to a first embodiment of the present disclosure.

Referring to FIG. 2, a first exemplary metal interconnect structure according to a first embodiment of the present disclosure is shown. The first exemplary metal interconnect structure can be a target interconnect structure for the design layout shown in FIG. 1. The first exemplary interconnect structure includes a stack, from bottom to top, of a substrate 8, a first dielectric material layer 10, a second dielectric material layer 20, an optional dielectric cap layer 30, a third dielectric material layer 40, and a stack of hard mask layers.

The substrate 8 can include a semiconductor substrate and at least one semiconductor device thereupon or therein. The substrate 8 may additionally include interconnect structures (not shown). Each of the first dielectric material layer 10, the second dielectric material layer 20, and the third dielectric material layer 40 can include a dielectric material such as silicon oxide, silicon nitride, silicon oxynitride, and/or porous or non-porous organosilicate glass (OSG). Each of the first dielectric material layer 10, the second dielectric material layer 20, and the third dielectric material layer 40 can have a thickness in a range from 50 nm to 300 nm, although lesser and greater thicknesses can also be employed.

The optional dielectric cap layer 30, if present, can include a dielectric material that prevents diffusion of metallic impurities therethrough. The optional dielectric cap layer 30 may include a dielectric material such as nitrogen-doped organosilicate glass and/or silicon nitride. The thickness of the optional dielectric cap layer 30, if present, can be from 10 nm to 40 nm, although lesser and greater thicknesses can also be employed. Each of the first dielectric material layer 10 and the third dielectric material layer 40 may include a dielectric material layer that includes a dielectric material that prevents diffusion of metallic impurities therethrough. For example, a bottom portion of the first dielectric material layer 10 and/or a bottom portion of the third dielectric material layer 40 may include a dielectric material that such as nitrogen-doped organosilicate glass and/or silicon nitride.

The first dielectric material layer 10 and the second dielectric material layer 20 may include a hard mask layer (not shown) including a dielectric material that is different from the dielectric material of the underlying portion of the first dielectric material layer 10 or the underlying portion of the second dielectric material layer 20. In this case, the hard mask layer can include, for example, silicon oxide or a non-porous organosilicate glass. The thickness of a hard mask layer can be, for example, from 3 nm to 10 nm, although lesser and greater thicknesses can also be employed. In one embodiment, each of the first dielectric material layer 10 and the second dielectric material layer 20 may include a stack, from bottom to top, of a porous dielectric material layer and a non-porous dielectric material layer.

In one embodiment, the first dielectric material layer 10 can include an M(x−1) level dielectric material layer, the second dielectric material layer 20 can include an Mx line level dielectric material layer, and the third dielectric material layer 30 can include an M(x+1) line level dielectric material layer. Mx line level conductive line structures (24, 26) may be embedded in the second dielectric material layer 20. The Mx line level conductive line structures (24, 26) are herein referred to as underlying conductive line level structures. The first dielectric material layer 10 may, or may not, be an interconnect-level dielectric material layer, and may, or may not, include line level conductive structures (not shown).

The Mx line level conductive line structures (24, 26) the underlying conductive line level structures are embedded in the second dielectric material layer 20. The top surfaces of the Mx line level conductive line structures (24, 26) can be coplanar with the top surface of the second dielectric material layer 20.

The Mx line level conductive line structures (24, 26) can include an interconnect conductive line structure 24 that provide electrical connections among electrical components as known in the art, and a via-catching conductive line structure 26. The via-catching conductive line structure 26 corresponds to a via-catching design shape 122 in the underlying conductive line level (i.e., the Mx line level) in the exemplary design layout. The interconnect conductive line structure 24 can include a metallic liner 21 and a metallic portion 22. The via-catching conductive line structure 26 can include another metallic liner 21' and another metallic portion 22'.

The stack of hard mask layers 46 can include at least one dielectric hard mask layer and at least one metallic hard mask layer. In one embodiment, the stack of hard mask layers 46 can include a first dielectric hard mask layer 41 including a first dielectric material, a lower metallic hard mask layer 45 including a first metallic material, a second dielectric hard mask layer 42 including a second dielectric material, an upper metallic hard mask layer 43 including a second metallic material, and a third dielectric hard mask layer 44 including a third dielectric material. In one embodiment, the first dielectric material layer 41 can include non-porous organosilicate glass, the second dielectric material layer 42 can include silicon oxide, each of the lower and upper metallic hard mask layers (45, 43) can include a metallic nitride and/or a metallic carbide such as TiN, TaN, and WN and/or TiC, TaC, and WC, and the third dielectric hard mask layer 44 can include silicon oxide. The thickness of the first dielectric hard mask layer 41 can be from 3 nm to 10 nm, the thickness of the lower metallic hard mask layer 45 can be from 8 nm to 30 nm, the thickness of the second dielectric hard mask layer 42 can be from 8 nm to 30 nm, the thickness of the upper metallic hard mask layer 43 can be from 15 nm to 60 nm, and the thickness of the third dielectric hard mask layer 44 can be from 20 nm to 80 nm, although lesser and greater thicknesses can also be employed for each layer.

A silicon-based polymer layer 51 may be formed over the stack of hard mask layers 46. The silicon-based polymer layer 51 can include a SiO-rich siloxane polymer such as HM8006™ by Honeywell©. The thickness of the silicon-based polymer layer 51 can be from 100 nm to 400 nm, although lesser and greater thicknesses can also be employed. A first silicon-based antireflective coating (ARC) layer 53 can be applied over the silicon-based polymer layer 51.

A first photoresist layer 57 can be formed over the first silicon-based ARC layer 53 and lithographically patterned with a first line pattern. The first line pattern includes the pattern defined by the first color M(x+1) line level design shapes 140 (See FIG. 1) of a design layout. The printing of the first line pattern in the first photoresist layer 57 can be performed by employing a first line level lithographic mask, which is a first lithographic mask for the M(x+1) line level (which is a conductive line level).

Figure 3:
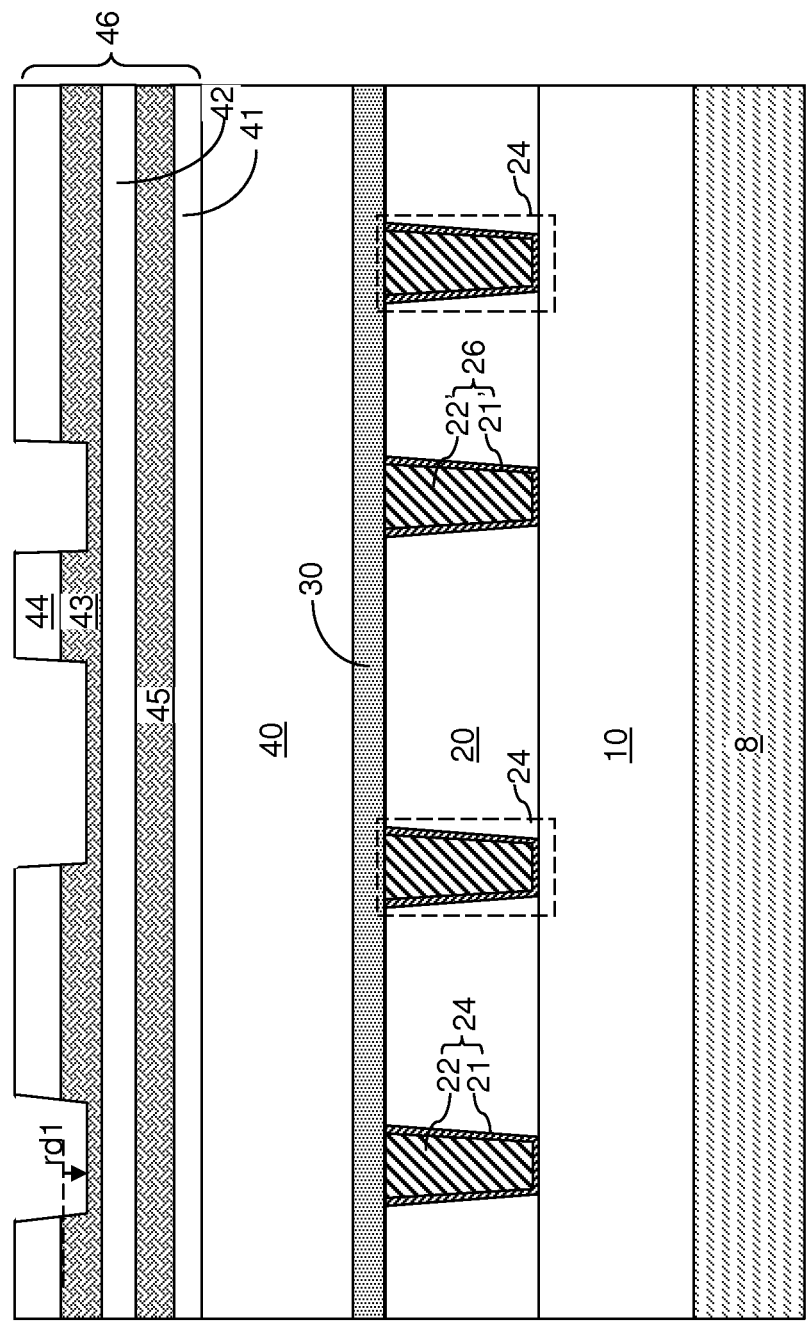
FIG. 3 is a vertical cross-sectional view of the first exemplary metal interconnect structure after transfer of the first line pattern into an upper metallic hard mask layers according to the first embodiment of the present disclosure.

Referring to FIG. 3, the first line pattern in the first photoresist layer 57 is transferred through the first silicon-based ARC layer 53 and the silicon-based polymer layer 51 and into an upper portion of the stack of hard mask layers 46 by an anisotropic etch such as a reactive ion etch. In one embodiment, the first line pattern can be transferred through the third dielectric hard mask layer 44 and into an upper region of the upper metallic hard mask layer 43 including a metallic material. The first photoresist layer 57, the first silicon-based ARC layer 53, and the silicon-based polymer layer 51 can be subsequently removed, for example, by ashing. The recessed surfaces of the stack of hard mask layers 46 can be recessed relative to the top surface of the upper metallic hard mask layer 43 by a first recess depth rd1.

The depth of the bottom surfaces of the recessed regions, as measured from the topmost surface of the upper metallic hard mask layer 43, is the first recess depth rd1. In one embodiment, the first recess depth rd1 can be greater than zero and is less than the thickness of the upper metallic hard mask layer 43. The bottom surface of each recessed region can be a recessed surface of the upper metallic hard mask layer 43 that is formed between the topmost surface of the upper metallic hard mask layer 43 and the bottom surface of the upper metallic hard mask layer 43. The areas of the recessed regions correspond to the first line pattern.

Figure 4:
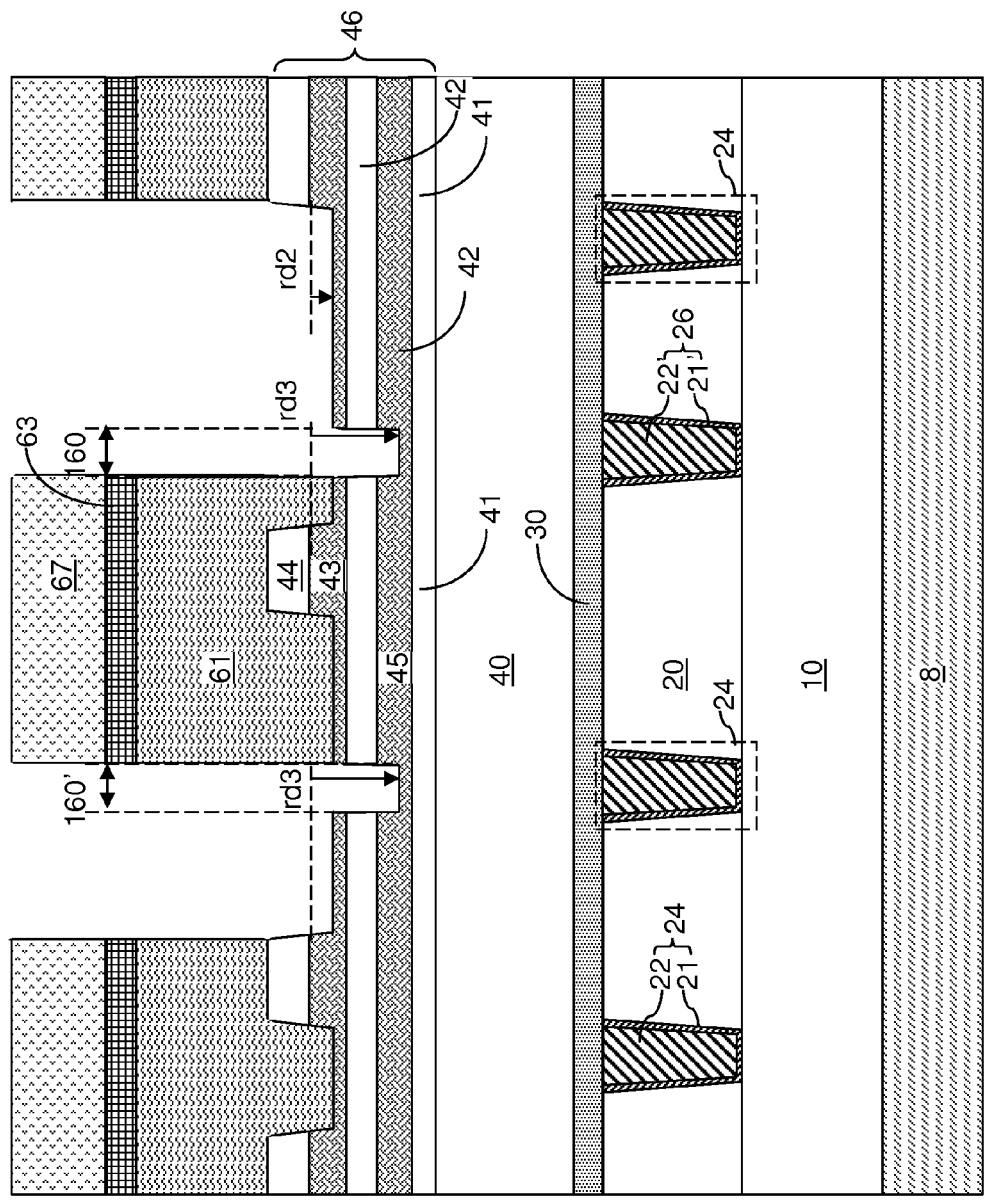
FIG. 4 is a vertical cross-sectional view of the first exemplary metal interconnect structure after lithographic patterning of a second photoresist layer with a second line pattern employing a second line level lithographic mask and transfer of the second line pattern into the upper metallic hard mask layers according to the first embodiment of the present disclosure.

Referring to FIG. 4, an organic planarization layer (OPL) 61 is applied to the top surface of the stack of hard mask layers 46, for example, by spin coating. The second OPL 61 includes an organic planarization material known in the art, and can have a thickness in a range from 50 nm to 300 nm, although lesser and greater thicknesses can also be employed. A second silicon-based antireflective coating (ARC) layer 63 can be applied over the first OPL 61.

A second photoresist layer 67 can be formed over the second silicon-based ARC layer 63 and lithographically patterned with a second line pattern. The second line pattern includes the pattern defined by the second color M(x+1) line level design shapes 150 (See FIG. 1) of the design layout. The printing of the second line pattern in the second photoresist layer 67 can be performed by employing a second line level lithographic mask, which is a second lithographic mask for the M(x+1) line level.

The first line pattern and the second line pattern overlap at each stitch region (160, 160'), which is a region on the metal interconnect structure that corresponds to an intersection of a first color M(x+1) line level design shape 140 and a second color M(x+1) line level design shape 150.

Figure 5:
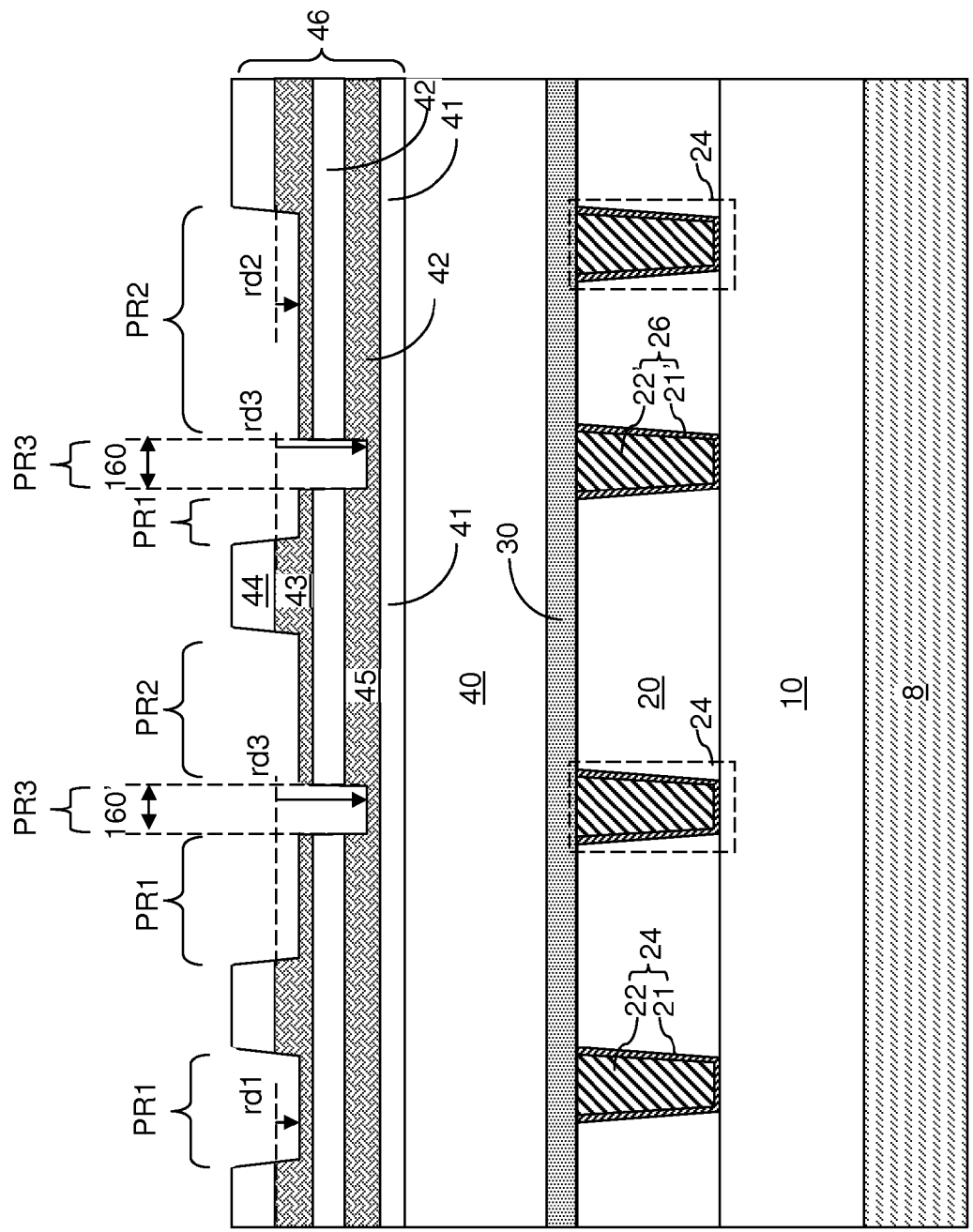
FIG. 5 is a vertical cross-sectional view of the first exemplary metal interconnect structure after removal of the second photoresist layer according to the first embodiment of the present disclosure.

Referring to FIG. 5, the second line pattern in the second photoresist layer 67 is transferred through the second silicon-based ARC layer 63 and the first OPL 61 and into an upper portion of the stack of hard mask layers 46 by an anisotropic etch such as a reactive ion etch. In one embodiment, the second line pattern can be transferred through the third dielectric hard mask layer 44 and into an upper region of the upper metallic hard mask layer 43. Each stitched region (160, 160') is etched further below the first recess depth rd1 during the reactive ion etch that transfers the second line pattern into the upper portion of the stack of hard mask layers 46. The second photoresist layer 67, the second silicon-based ARC layer 63, and the first OPL 61 can be subsequently removed, for example, by ashing.

Each region of the first exemplary metal interconnect structure corresponding to an area of the first color M(x+1) line level design shapes 140 that do not overlap the second color M(x+1) line level design shapes 150 is herein referred to as a first pattern region PR1. Each region of the first exemplary metal interconnect structure corresponding to an area of the second color M(x+1) line level design shapes 150 that do not overlap the first color M(x+1) line level design shapes 140 is herein referred to as a second pattern region PR2. Each region of the first exemplary metal interconnect structure corresponding to an area of overlap between the first color M(x+1) line level design shapes 140 and the second color M(x+1) line level design shapes 150, i.e., the areas of a stitch region (160, 160'), is herein referred to as a third pattern region PR3.

The recessed surfaces of the stack of hard mask layers 46 in the first pattern region PR1 can be recessed relative to the top surface of the upper metallic hard mask layer 43 by the first recess depth rd1. The recessed surfaces of the stack of hard mask layers 46 in the second pattern region PR2 can be recessed relative to the top surface of the upper metallic hard mask layer 43 by a second recess depth rd2. The second recess depth rd2 may be the same as, or may be different from, the first recess depth rd1. In one embodiment, the second recess depth rd2 is greater than zero and is less than the thickness of the upper metallic hard mask layer 43. The recessed surfaces of the stack of hard mask layers 46 in the third pattern region PR3 can be recessed relative to the top surface of the upper metallic hard mask layer 43 by a third recess depth rd3. The third recess depth rd3 is greater than the first recess depth rd1, and is greater than the second recess depth rd2. In one embodiment, the third recess depth rd3 can be greater than the thickness of the upper metallic hard mask layer 43. In one embodiment, the third recess depth rd3 can be greater than the sum of the thickness of the upper metallic hard mask layer 43 and the thickness of the second dielectric hard mask layer 42.

A cavity is formed within each area of intersection between the first pattern and the second pattern. Each of the cavities is within the third pattern region PR3. Each cavity has a bottom surface below a first horizontal plane including a bottom surface of the second dielectric hard mask layer 42 and above a second horizontal plane including a top surface of the third dielectric material layer 40. In one embodiment, the bottommost surface of each cavity can be a recessed top surface of the lower metallic hard mask layer 45. In this case, bottom surfaces of recessed regions corresponding to the first and second pattern regions (PR1, PR2) outside of the cavities can be recessed surfaces of the upper metallic hard mask layer 43.

The stack of hard mask layers 46 includes the upper metallic hard mask layer 43 as a patterned hard mask layer. The patterned hard mask layer, as embodied in the upper metallic hard mask layer 43, includes a first pattern region PR1 in which a portion of a top surface of the patterned hard mask layer is recessed relative to a topmost surface of the upper metallic hard mask layer 43 by a first recess depth rd1, a second pattern region PR2 in which another portion of the top surface of the patterned hard mask layer is recessed relative to the topmost surface of the upper metallic hard mask layer 43 by a second recess depth rd2, and a third pattern region PR3 adjoining the first pattern region and the second pattern region that is recessed relative to the topmost surface of the upper metallic hard mask layer 43 by a third recess depth rd3 that is greater than the first recess depth rd1 and is greater than the second recess depth rd2. The entirety of each area of the third pattern region PR3 can be within the area of the underling conductive line structure, i.e., a via-catching conductive line structure 26 or an interconnect conductive line structure 24, in a see-through top-down view along a direction perpendicular to the topmost surface of the patterned hard mask layers 46 according to the design layout illustrated in FIG. 1. The upper metallic hard mask layer 43 includes a composite pattern that is a first combination, i.e., a union, of the first line pattern and the second line pattern. The lower metallic hard mask layer 45 includes a composite pattern that is a second combination, i.e., an intersection, of the first line pattern and the second line pattern.

Figure 6:
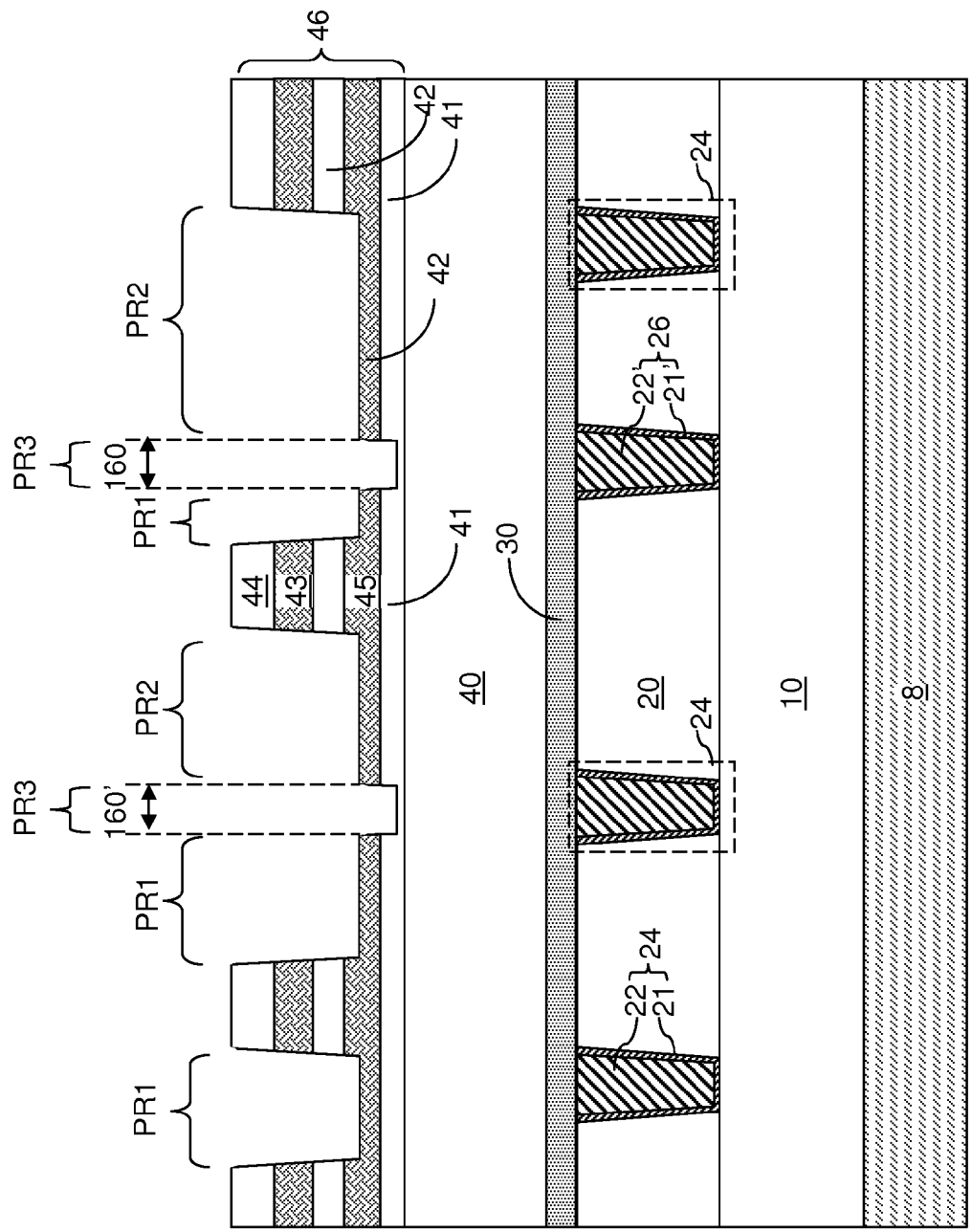
FIG. 6 is a vertical cross-sectional view of the first exemplary metal interconnect structure after transfer of the combination of the first line pattern and the second line pattern into a lower metallic hard mask layer and a first dielectric hard mask layer according to the first embodiment of the present disclosure.

Referring FIG. 6, the union of the first line pattern and the second line pattern is transferred through the second dielectric hard mask layer 42 and into the lower metallic hard mask layer 45 by another anisotropic etch. At this step, the stack of hard mask layers 46 includes the third dielectric hard mask layer 44 (if not completely consumed and present at this step), the upper metallic hard mask layer 43, the second dielectric hard mask layer 42, and the lower metallic hard mask layer 45 as patterned hard mask layers having the pattern of the union of the first line pattern and the second line pattern. The patterned hard mask layers 46, includes a first pattern region PR1 in which a portion of a top surface of the patterned hard mask layer is recessed relative to a topmost surface of the patterned hard mask layer by a recess depth, a second pattern region PR2 in which another portion of the top surface of the patterned hard mask layer is recessed relative to the topmost surface of the patterned hard mask layer by another recess depth, and a third pattern region PR3 adjoining the first pattern region and the second pattern region that is recessed relative to the topmost surface of the patterned hard mask layer by yet another recess depth that is greater than the recess depth of the first pattern region PR1 and is greater than the another recess depth of the second pattern region PR2. The entirety of each area of the third pattern region PR3 can be within the area of the underling conductive line structure, i.e., a via-catching conductive line structure 26 or an interconnect conductive line structure 24, in a see-through top-down view along a direction perpendicular to the topmost surface of the patterned hard mask layers 46 according to the design layout illustrated in FIG. 1. A lower portion of the lower metallic hard mask layer 45 and an upper portion of the first dielectric hard mask layer 41 include a composite pattern that is an intersection of the first line pattern and the second line pattern.

Figure 7:
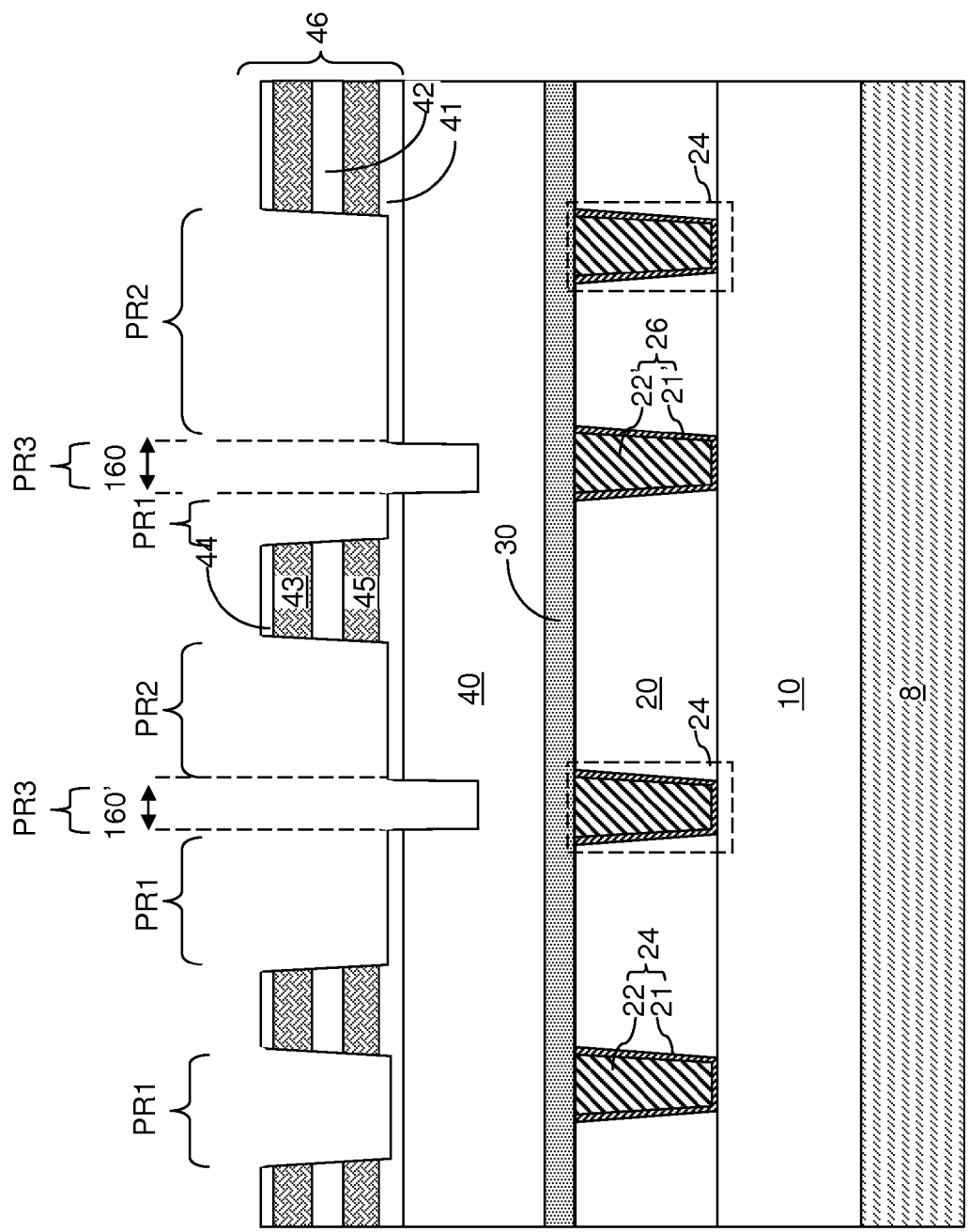
FIG. 7 is a vertical cross-sectional view of the first exemplary metal interconnect structure after transfer of the composite pattern into a dielectric material layer and the first dielectric hard mask layer according to the first embodiment of the present disclosure.

Referring to FIG. 7, the anisotropic etch is continued, with or without modification of the etch chemistry, to further recess the recessed surfaces of the first, second, and third pattern regions (PR1, PR2, PR3). The anisotropic etch can employ the third dielectric hard mask 44 as an etch mask. The anisotropic etch can be a reactive ion etch. The bottom surface of a cavity within each third pattern region PR3 is recessed below said a horizontal plane including the top surface of the third dielectric material layer 40, while recessed surfaces outside of the cavities that are present in the first and second pattern regions (PR1, PR2) are recessed to a height between the horizontal plane including the bottom surface of the second dielectric hard mask layer 42 and the horizontal plane including the top surface of the third dielectric material layer 40. The horizontal plane including the bottom surface of the second dielectric hard mask layer is herein referred to as a first horizontal plane, and the horizontal plane including the top surface of the third dielectric material layer 40 is herein referred to as a second horizontal plane.

Figure 8:
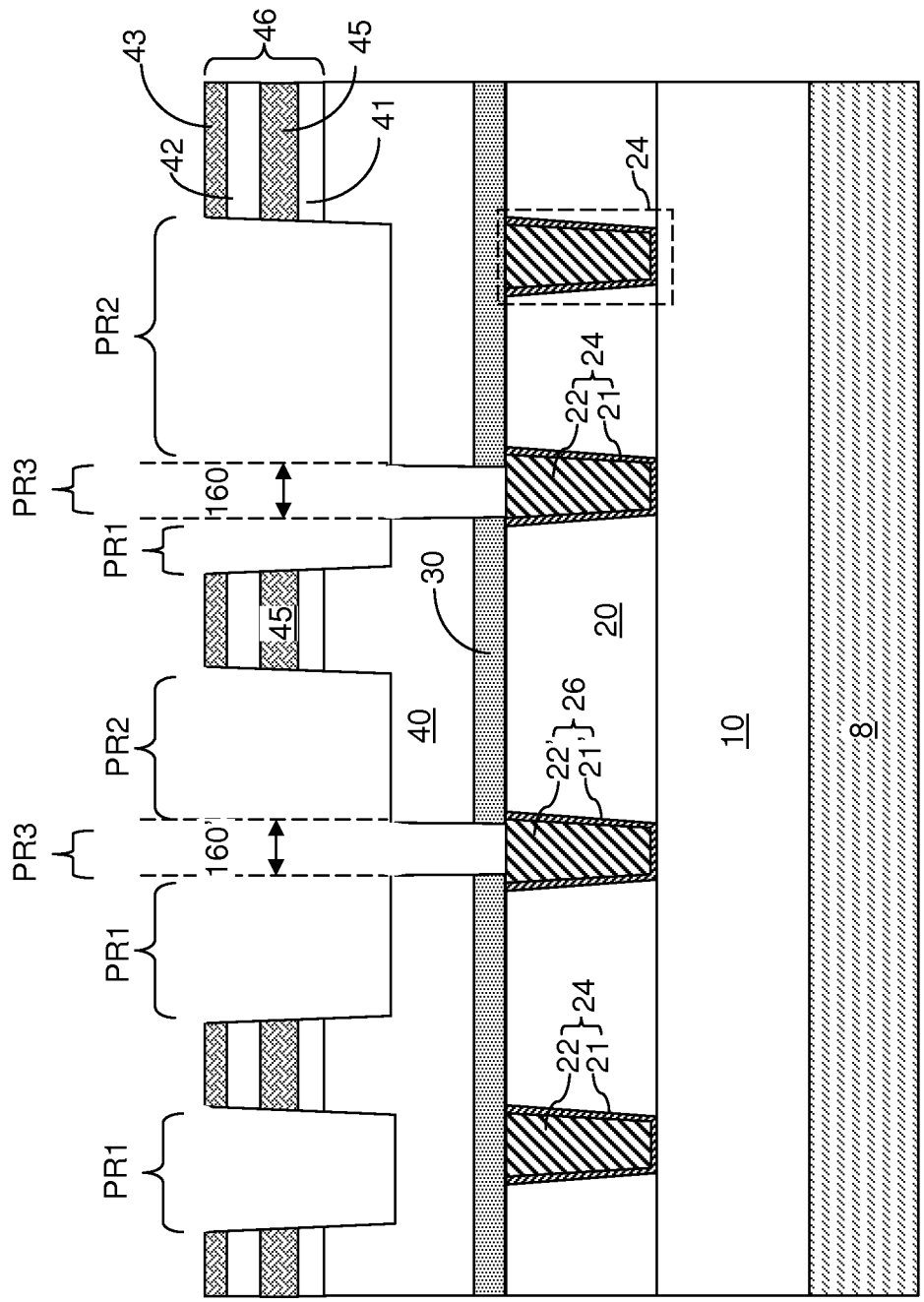
FIG. 8 is a vertical cross-sectional view of the first exemplary metal interconnect structure after transfer of the composite pattern into the dielectric material layer according to the first embodiment of the present disclosure.

Referring to FIG. 8, the anisotropic etch is continued, with or without modification of the etch chemistry, to further recess the recessed surfaces of the first, second, and third pattern regions (PR1, PR2, PR3). The anisotropic etch can employ the upper metallic hard mask layer 43, and optionally the third dielectric hard mask 44 if any remaining portion is present, as an etch mask. The anisotropic etch can be a reactive ion etch. The bottom surface of a cavity within each third pattern region PR3 is recessed through the third dielectric material layer 40 and the optional dielectric cap layer 30 (if present) so that one of the Mx line level conductive line structures (24, 26), i.e., the underlying conductive line structures is physically exposed at the bottom of each cavity, while recessed surfaces outside of the cavities that are present in the first and second pattern regions (PR1, PR2) are recessed to a height between the horizontal plane including the top surface of the third dielectric material layer 40 and between the horizontal plane including the bottom surface of the third dielectric material layer 40.

Each continuous recessed space below the horizontal plane including the topmost surface of the stack of hard mask layers 46 includes a line pattern or a combination of a line pattern and a via cavity. If a continuous recessed space below the horizontal plane including the topmost surface of the stack of hard mask layers 46 includes a via cavity corresponding to a third pattern region PR3, the continuous recessed space further includes a line trench, which is formed in an adjacent first pattern region PR1 and an adjacent second pattern region PR2. The via cavity is formed within an area of the top surface of one of an underlying conductive line structures, and the entirety of the bottom surface of the via cavity can be a subset of the top surface of the underlying conductive line structure. Thus, the underlying conductive line structures is physically exposed at the bottom of the via cavity after formation of the continuous recessed space, which constitutes an integrated line and via cavity that includes the via cavity and a continuous line cavity that overlies the entire area of the via cavity.

Figure 9:
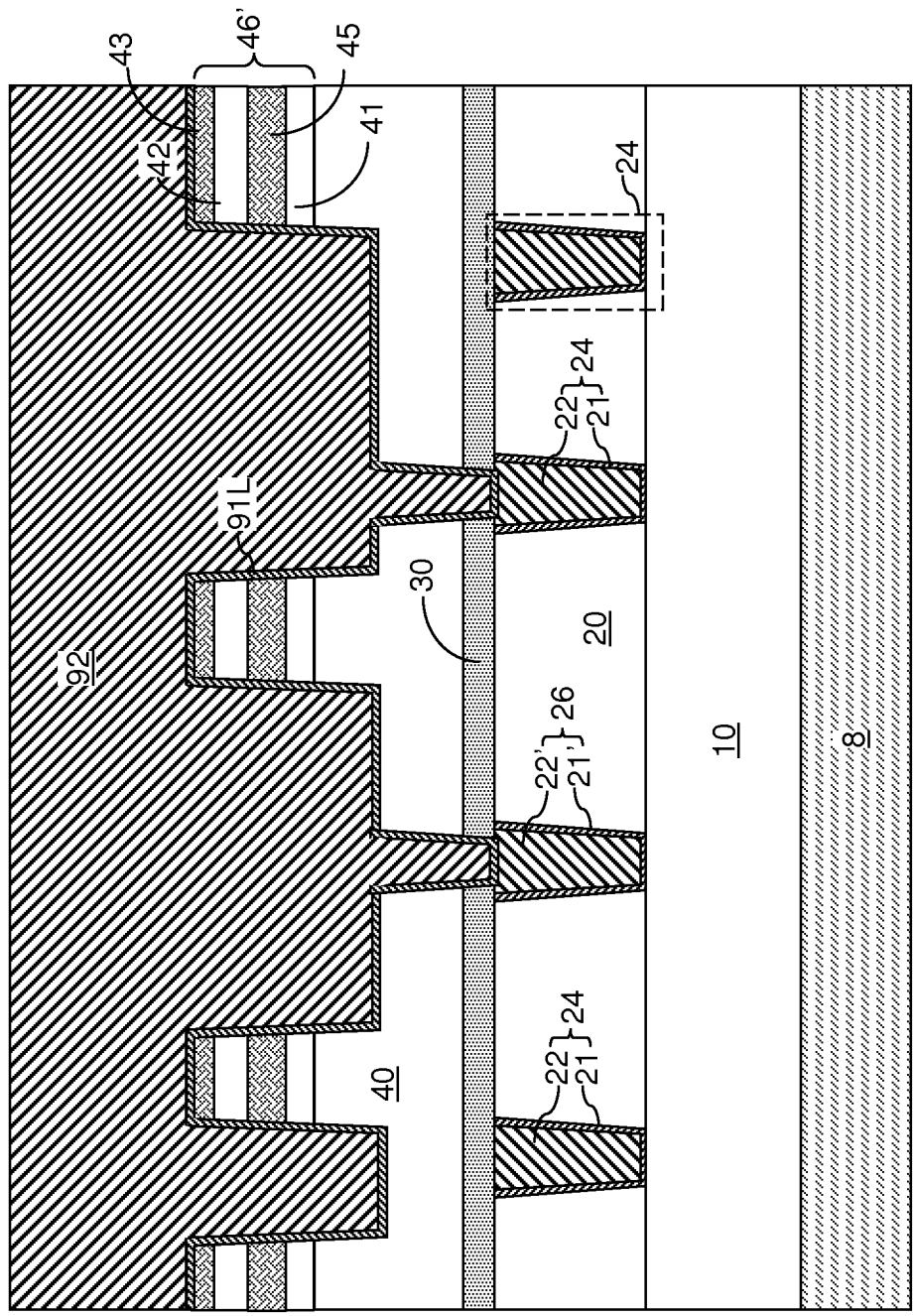
FIG. 9 is a vertical cross-sectional view of the first exemplary metal interconnect structure after depositing at least one metal in the via cavities and line cavities according to the first embodiment of the present disclosure.

Referring to FIG. 9, a metallic liner layer 91L is deposited in various continuous recessed spaces (which include the integrated line and via cavities and line trenches that are not connected to a via cavity) and above the remaining portions of the stack of hard mask layers 46', for example, by physical vapor deposition and/or chemical vapor deposition. The hard mask layers 46' can include the first dielectric hard mask layer 41, the lower metallic hard mask layer 45, the second dielectric hard mask layer 42, and the upper metallic hard mask layer 43. The metallic liner layer 91L can include a material such as TiN, TaN, WN, and combinations thereof.

A metal layer 92 is subsequently deposited to fill the various continuous recessed spaces, for example, by electroplating, electroless plating, chemical vapor deposition, physical vapor deposition, and/or vacuum evaporation. The metal layer 92 includes at least one metallic material such as copper, aluminum, tungsten, or combinations thereof.

Figure 10:
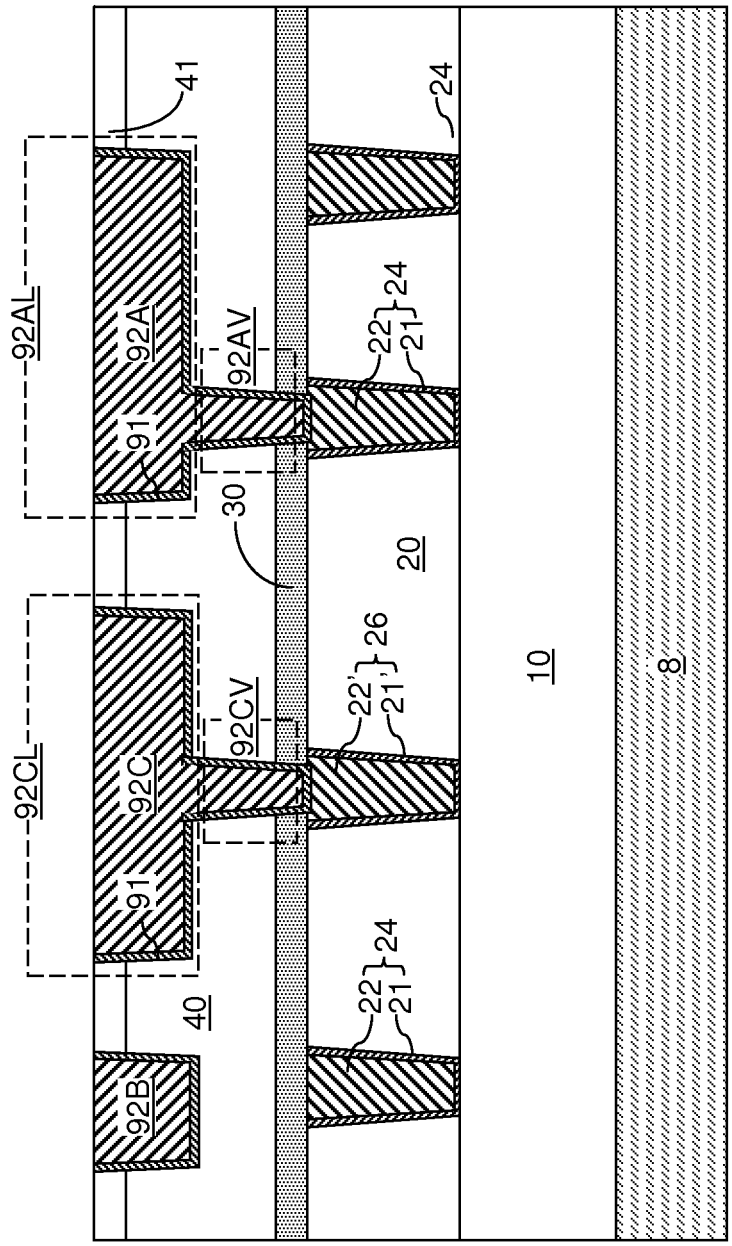
FIG. 10 is a vertical cross-sectional view of the first exemplary metal interconnect structure after formation of via structures and line structures in the interconnect level dielectric layer according to the first embodiment of the present disclosure.
Figure 11:
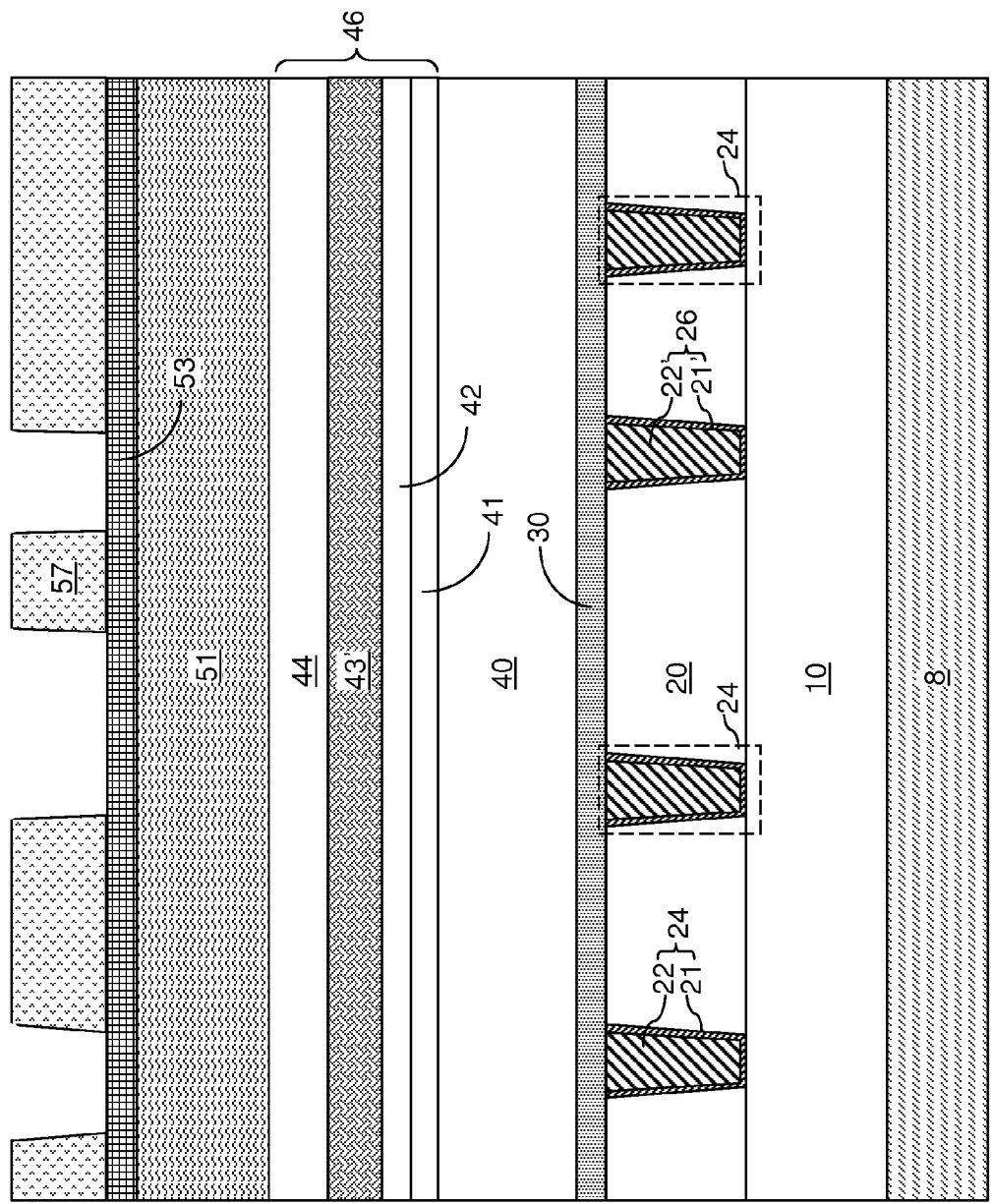
FIG. 11 is a vertical cross-sectional view of a second exemplary metal interconnect structure after formation of underlying conductive line level structures and lithographic patterning of a first photoresist layer with a first line pattern employing a first line level lithographic mask for a conductive line level according to a second embodiment of the present disclosure.

Referring to FIG. 10, the metal layer 92, the metallic liner layer 91L, the upper metallic hard mask layer 43, the second dielectric hard mask layer 42, and the lower metallic hard mask layer 42 can be planarized, for example, employing a chemical mechanical planarization (CMP) process. The first dielectric hard mask layer 41 can be employed as a stopping layer for the CMP process. Various via structures and line structures embedded in the third dielectric material layer 40 and the first dielectric hard mask layer 41 are formed.

The various via structures and line structures include integrated conductive line and via structures (92A, 92C), which are contiguous conductive structures filling a line trench and at least one via cavity. Each integrated conductive line and via structure (92A, 92C) includes a conductive line structure and at least one via structure.

The integrated conductive line and via structures (92A, 92C) can include a conductive-via-including conductive line and via structure 92A that provides electrical connections among components across the M(x+1) line level and the Mx line level as known in the art. Each via structure portion of a conductive-via-including conductive line and via structure 92A corresponds to a via-derived stitch 160 in a design layout. The via structure of the conductive-via-including conductive line and via structure 92A vertically interconnects the conductive line structure of the conductive-via-including conductive line and via structure 92A and an underlying conductive line structure, which is an interconnect conductive line structure 24 embedded in the Mx line level.

M(x+1) line level conductive line structures 92B are conductive structures filling a line trench. The M(x+1) line level conductive line structures 92B are line level structures that do not extend below the M(x+1) line level, i.e., does not have any via structure attached thereupon. A metallic liner 91 may be included in each of the M(x+1) line level conductive line structure 92B and integrated conductive line and via structures (92A, 92C).

The integrated conductive line and via structures (92A, 92C) can further include an electrically-inactive-via-including conductive line and via structure 92C, which corresponds to an M(x+1) line level design shape including a stitch in the design layout. The via structure that is a portion of the electrically-inactive-via-including conductive line and via structure 92C is a collateral via structure that is formed due to the line-overlap-derived stitch 160' present in an M(x+1) line level design shape that defines the line structure portion of the electrically-inactive-via-including conductive line and via structure 92C. The via structure 92CV of the electrically-inactive-via-including conductive line and via structure 92C vertically interconnects the conductive line structure 92CL of the electrically-inactive-via-including conductive line and via structure 92C and an underlying conductive line structure, which is a via-catching conductive line structure 26 embedded in the Mx line level of the first exemplary metal interconnect structure and corresponding to a via-catching design shape 122 in the Mx line level of the design layout.

In one embodiment, at least one of the conductive line structure 92CL (present within the electrically-inactive-via-including conductive line and via structure 92C) and the via-catching conductive line structure 26 (which is an underlying line structure) does not contact any conductive structure other than the via structure 92CV. In one embodiment, the conductive line structure 92CL within the electrically-inactive-via-including conductive line and via structure 92C does not contact any conductive structure other than the underlying via structure 92CV. In another embodiment, the via-catching conductive line structure 26 (i.e., the underlying conductive line structure in the Mx line level) does not contact any conductive structure other than the overlying via structure 92CV. In yet another embodiment, both of the conductive line structure 92CL within the electrically-inactive-via-including conductive line and via structure 92C and the via-catching conductive line structure 26 do not contact any conductive structure other than the via structure 92CV.

Figure 13:
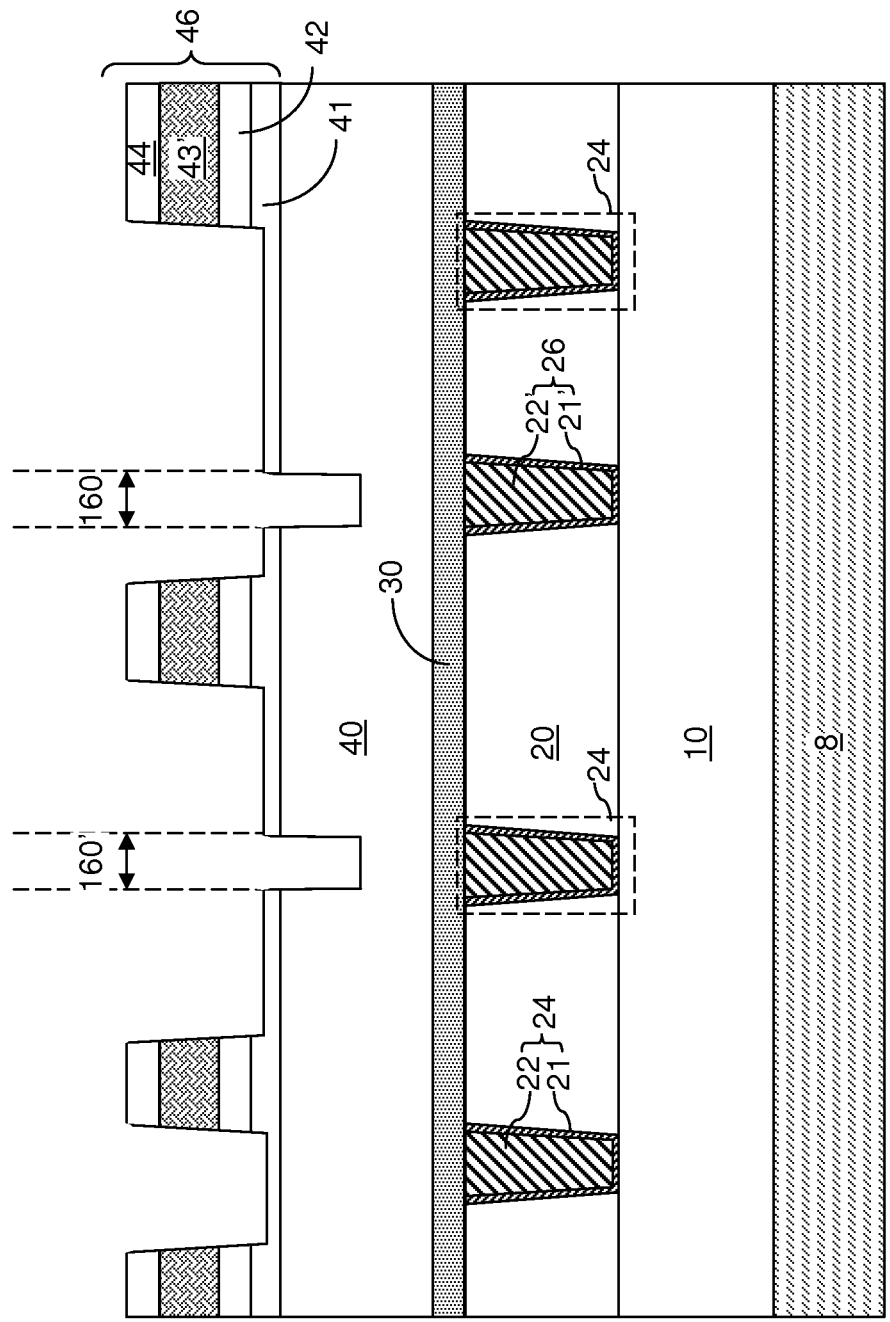
FIG. 13 is a vertical cross-sectional view of the second exemplary metal interconnect structure after transfer of the composite pattern into a dielectric material layer and the first dielectric hard mask layer according to the second embodiment of the present disclosure.

Referring to FIG. 13A, a second exemplary semiconductor structure according to a second embodiment of the present disclosure is derived from the first exemplary semiconductor structure of FIG. 2 by removing the lower metallic hard mask layer 45 from the stack of hard mask layers 46. Thus, the stack of the hard mask layer 46 of the second embodiment includes, from bottom to top, a first dielectric hard mask layer 41, a second dielectric hard mask layer 42, a metallic hard mask layer 43' and a third dielectric hard mask layer 44.

The thickness of the first dielectric hard mask layer 41 can be from 6 nm to 30 nm, the thickness of the second dielectric hard mask layer 42 can be from 8 nm to 30 nm, the thickness of the metallic hard mask layer 43' can be from 15 nm to 60 nm, and the thickness of the third dielectric hard mask layer 44 can be from 20 nm to 80 nm, although lesser and greater thicknesses can also be employed for each layer.

Figure 12:
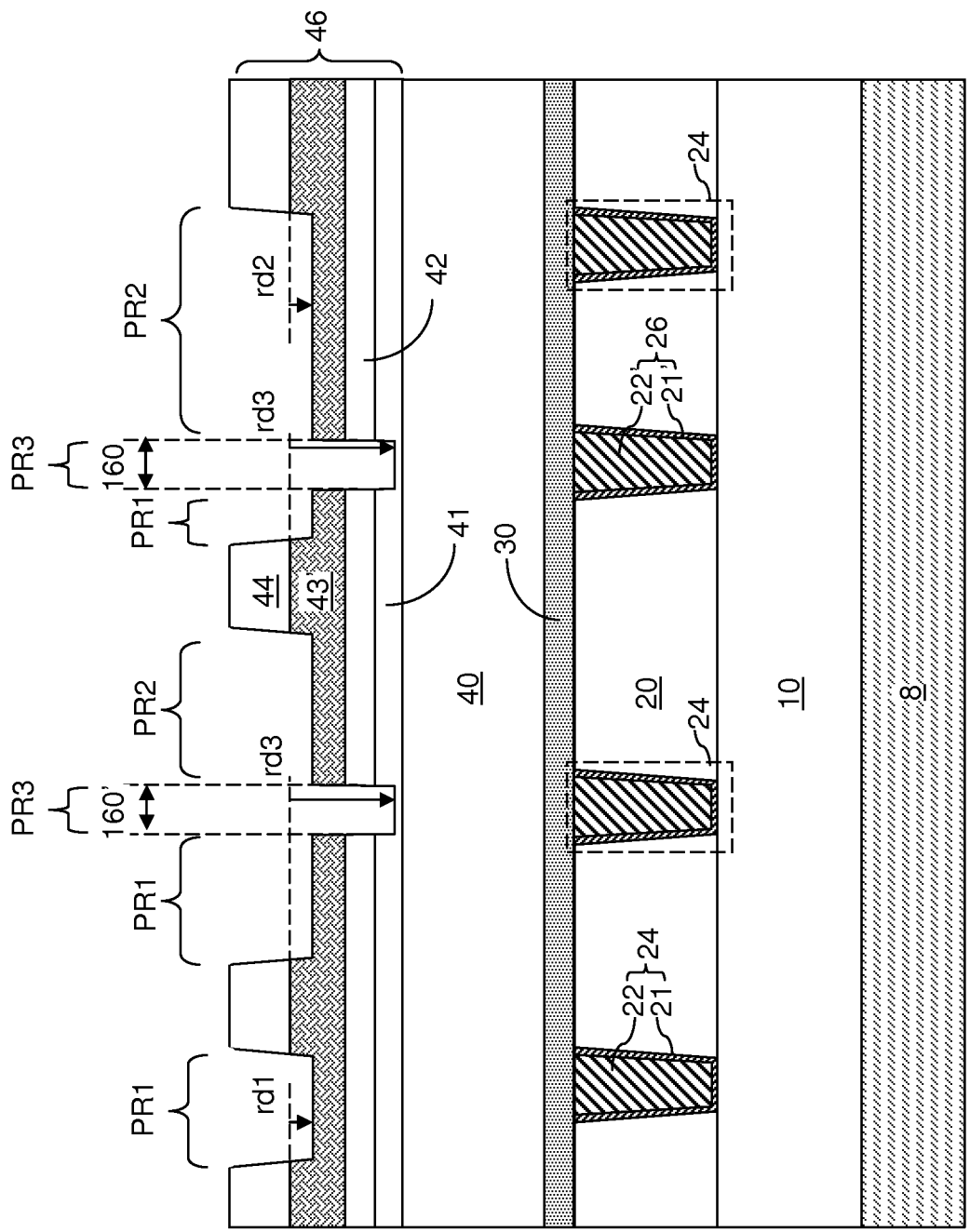
FIG. 12 is a vertical cross-sectional view of the second exemplary metal interconnect structure after transfer of a second line pattern into the upper metallic hard mask layer and removal of a second photoresist layer according to the second embodiment of the present disclosure.

Referring to FIG. 12, the processing steps of FIGS. 2-5 are performed to transfer a combination of a first patter and a second pattern into the stack of hard mask layers 46. The recessed surfaces of the stack of hard mask layers 46 in the first pattern region PR1 can be recessed relative to the top surface of the metallic hard mask layer 43' by the first recess depth rd1. The recessed surfaces of the stack of hard mask layers 46 in the second pattern region PR2 can be recessed relative to the top surface of the metallic hard mask layer 43' by a second recess depth rd2. The second recess depth rd2 may be the same as, or may be different from, the first recess depth rd1. In one embodiment, the second recess depth rd2 is greater than zero and is less than the thickness of the metallic hard mask layer 43'. The recessed surfaces of the stack of hard mask layers 46 in the third pattern region PR3 can be recessed relative to the top surface of the metallic hard mask layer 43 by a third recess depth rd3. The third recess depth rd3 is greater than the first recess depth rd1, and is greater than the second recess depth rd2. In one embodiment, the third recess depth rd3 can be greater than the thickness of the metallic hard mask layer 43'. In one embodiment, the third recess depth rd3 can be greater than the sum of the thickness of the metallic hard mask layer 43' and the thickness of the second dielectric hard mask layer 42.

A cavity is formed within each area of intersection between the first pattern and the second pattern. Each of the cavities is within a third pattern region PR3. Each cavity has a bottom surface below a first horizontal plane including a bottom surface of the second dielectric hard mask layer 42 and above a second horizontal plane including a top surface of the third dielectric material layer 40. In one embodiment, the bottommost surface of each cavity can be a recessed top surface of the first dielectric hard mask layer 41. In this case, bottom surfaces of recessed regions corresponding to the first and second pattern regions (PR1, PR2) outside of the cavities can be recessed surfaces of the metallic hard mask layer 43'.

The stack of hard mask layers 46 includes the metallic hard mask layer 43' as a patterned hard mask layer. The patterned hard mask layer, as embodied in the metallic hard mask layer 43', includes a first pattern region PR1 in which a portion of a top surface of the patterned hard mask layer is recessed relative to a topmost surface of the metallic hard mask layer 43' by a first recess depth rd1, a second pattern region PR2 in which another portion of the top surface of the patterned hard mask layer is recessed relative to the topmost surface of the metallic hard mask layer 43' by a second recess depth rd2, and a third pattern region PR3 adjoining the first pattern region and the second pattern region that is recessed relative to the topmost surface of the metallic hard mask layer 43' by a third recess depth rd3 that is greater than the first recess depth rd1 and is greater than the second recess depth rd2. The entirety of each area of the third pattern region PR3 can be within the area of the underling conductive line structure, i.e., a via-catching conductive line structure 26 or an interconnect conductive line structure 24, in a see-through top-down view along a direction perpendicular to the topmost surface of the patterned hard mask layers 46 according to the design layout illustrated in FIG. 1. The metallic hard mask layer 43' includes a composite pattern that is a first combination, i.e., a union, of the first line pattern and the second line pattern. The first dielectric hard mask layer 41 includes a composite pattern that is a second combination, i.e., an intersection, of the first line pattern and the second line pattern.

Figure 14:
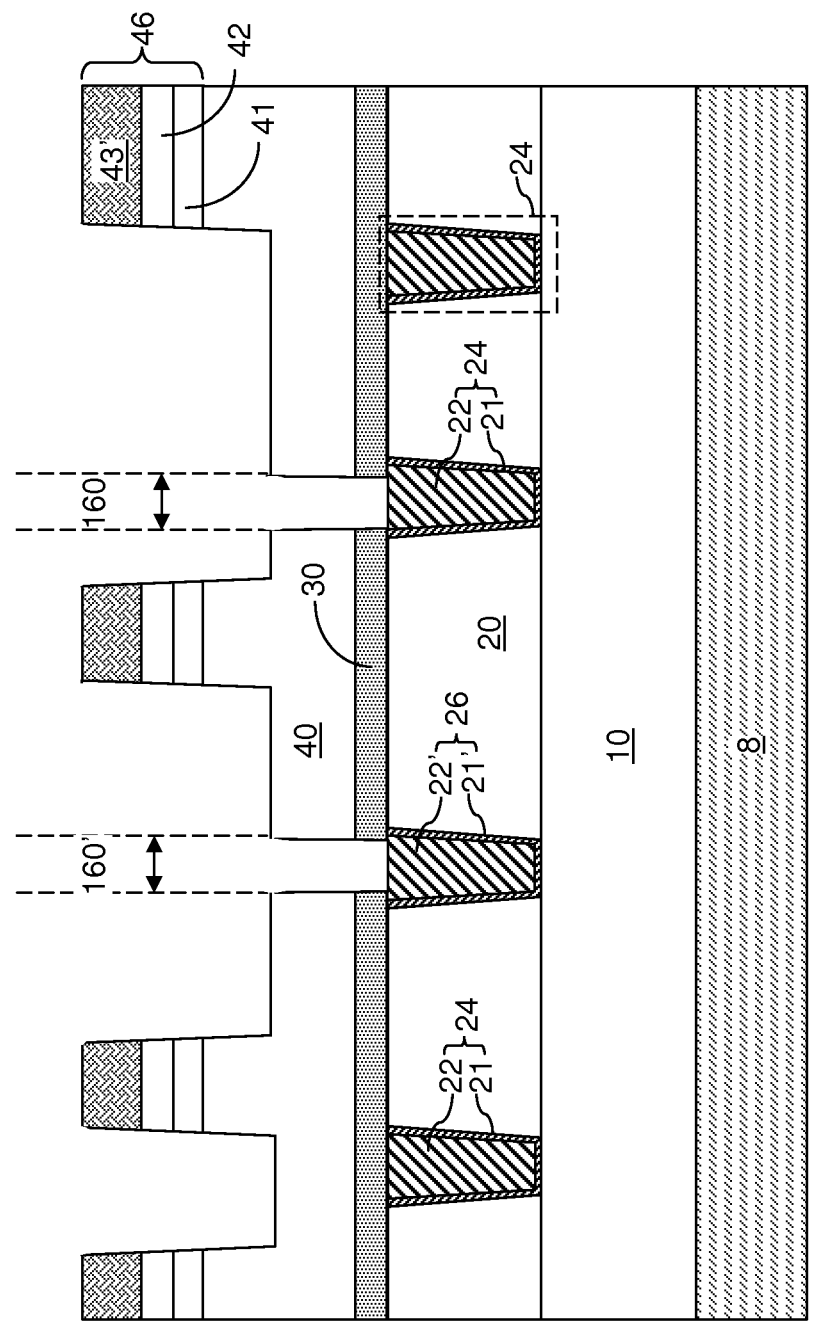
FIG. 14 is a vertical cross-sectional view of the second exemplary metal interconnect structure after transfer of the composite pattern into the dielectric material layer according to the second embodiment of the present disclosure.

Referring FIG. 14, the union of the first line pattern and the second line pattern is transferred through the second dielectric hard mask layer 42 and into the first dielectric hard mask layer 41 by another anisotropic etch. At this step, the stack of hard mask layers 46 includes the third dielectric hard mask layer 44 (if not completely consumed and present at this step), the metallic hard mask layer 43', the second dielectric hard mask layer 42, and the first dielectric hard mask layer 41 as patterned hard mask layers having the pattern of the union of the first line pattern and the second line pattern. The patterned hard mask layers 46, includes a first pattern region PR1 in which a portion of a top surface of the patterned hard mask layer is recessed relative to a topmost surface of the patterned hard mask layer by a recess depth, a second pattern region PR2 in which another portion of the top surface of the patterned hard mask layer is recessed relative to the topmost surface of the patterned hard mask layer by another recess depth, and a third pattern region PR3 adjoining the first pattern region and the second pattern region that is recessed relative to the topmost surface of the patterned hard mask layer by yet another recess depth that is greater than the recess depth of the first pattern region PR1 and is greater than the another recess depth of the second pattern region PR2. The entirety of each area of the third pattern region PR3 can be within the area of the underling conductive line structure, i.e., a via-catching conductive line structure 26 or an interconnect conductive line structure 24, in a see-through top-down view along a direction perpendicular to the topmost surface of the patterned hard mask layers 46 according to the design layout illustrated in FIG. 1. A lower portion of the first dielectric hard mask layer 41 and an upper portion of the first dielectric hard mask layer 41 include a composite pattern that is an intersection of the first line pattern and the second line pattern.

Referring to FIG. 14, the anisotropic etch is continued, with or without modification of the etch chemistry, to further recess the recessed surfaces of the first, second, and third pattern regions (PR1, PR2, PR3). The anisotropic etch can employ the metallic hard mask layer 43', and optionally the third dielectric hard mask 44 if any remaining portion is present, as an etch mask. The anisotropic etch can be a reactive ion etch. The bottom surface of a cavity within each third pattern region PR3 is recessed through the third dielectric material layer 40 and the optional dielectric cap layer 30 (if present) so that one of the Mx line level conductive line structures (24, 26), i.e., the underlying conductive line structures is physically exposed at the bottom of each cavity, while recessed surfaces outside of the cavities that are present in the first and second pattern regions (PR1, PR2) are recessed to a height between the horizontal plane including the top surface of the third dielectric material layer 40 and between the horizontal plane including the bottom surface of the third dielectric material layer 40.

Each continuous recessed space below the horizontal plane including the topmost surface of the stack of hard mask layers 46 includes a line pattern or a combination of a line pattern and a via cavity. If a continuous recessed space below the horizontal plane including the topmost surface of the stack of hard mask layers 46 includes a via cavity corresponding to a third pattern region PR3, the continuous recessed space further includes a line trench, which is formed in an adjacent first pattern region PR1 and an adjacent second pattern region PR2. The via cavity is formed within an area of the top surface of one of an underlying conductive line structures, and the entirety of the bottom surface of the via cavity can be a subset of the top surface of the underlying conductive line structure. Thus, the underlying conductive line structures is physically exposed at the bottom of the via cavity after formation of the continuous recessed space, which constitutes an integrated line and via cavity that includes the via cavity and a continuous line cavity that overlies the entire area of the via cavity.

Figure 15:
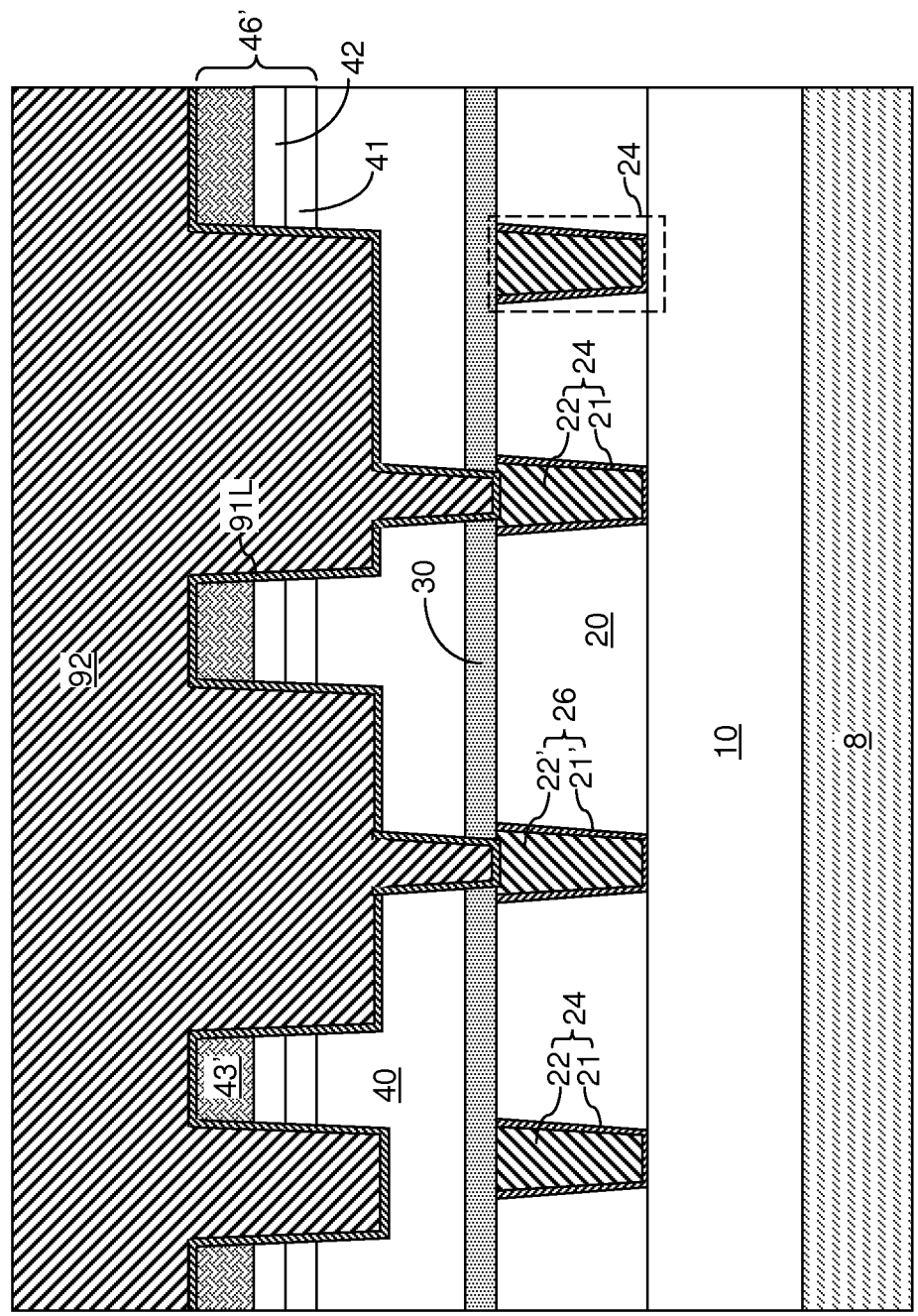
FIG. 15 is a vertical cross-sectional view of the second exemplary metal interconnect structure after depositing at least one metal in the via cavities and line cavities according to the second embodiment of the present disclosure.

Referring to FIG. 15, a metallic liner layer 91L can be deposited in various continuous recessed spaces (which include the integrated line and via cavities and line trenches that are not connected to a via cavity) and above the remaining portions of the stack of hard mask layers 46', for example, by physical vapor deposition and/or chemical vapor deposition in the same manner as in the first embodiment. The hard mask layers 46' can include the first dielectric hard mask layer 41, the second dielectric hard mask layer 42, and the metallic hard mask layer 43'. The metallic liner layer 91L can include a material such as TiN, TaN, WN, and combinations thereof.

A metal layer 92 is subsequently deposited to fill the various continuous recessed spaces, for example, by electroplating, electroless plating, chemical vapor deposition, physical vapor deposition, and/or vacuum evaporation. The metal layer 92 includes at least one metallic material such as copper, aluminum, tungsten, or combinations thereof. Subsequently, the processing steps of FIG. 10 can be performed to provide a structure that can be identical to the first exemplary structure illustrated in FIG. 10.

Figure 16:
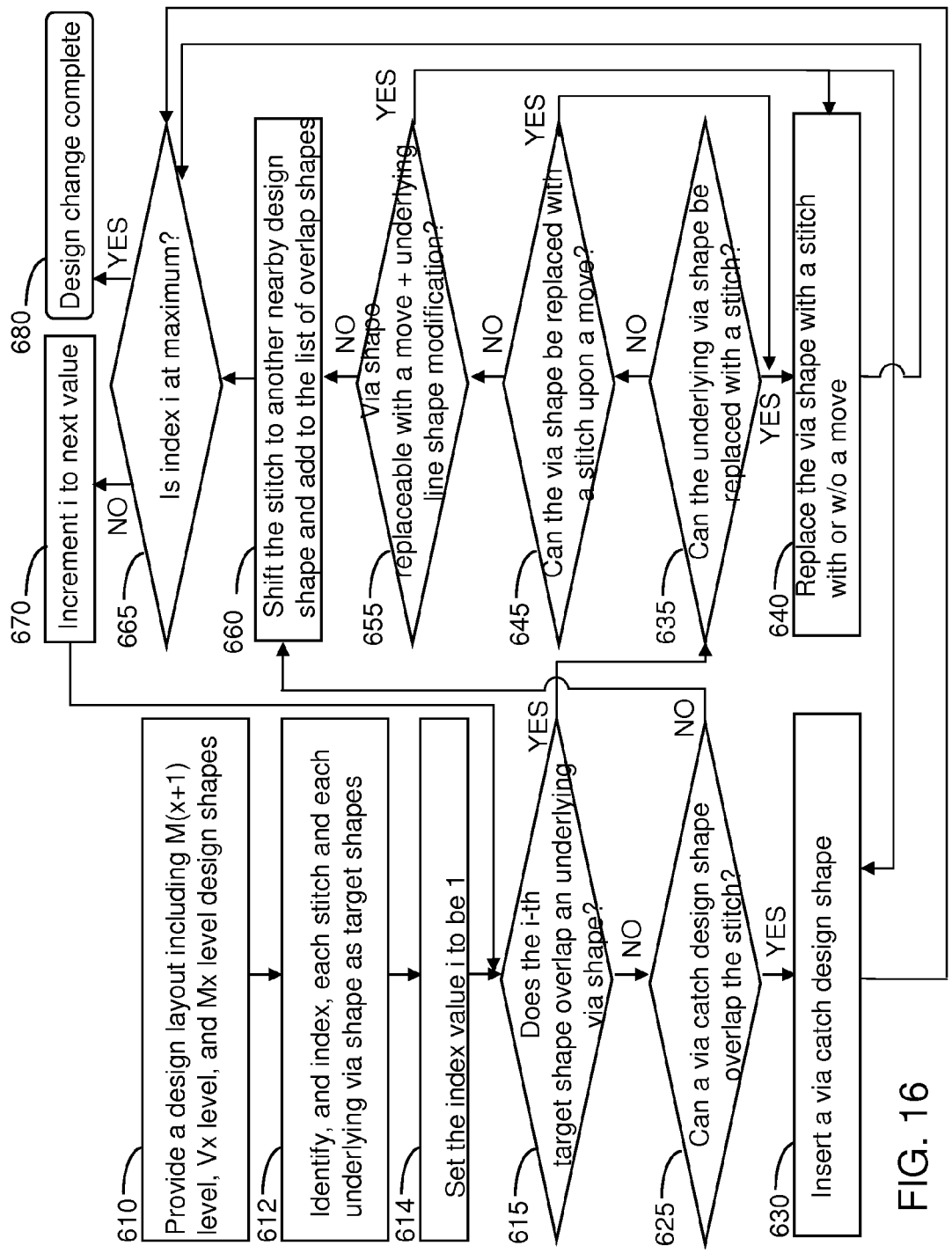
FIG. 16 is a flow chart illustrating a series of steps for generating stitches within line-level design shapes to replace via-level design shapes according to an embodiment of the present disclosure.

Referring to FIG. 16, a first flow chart illustrates a series of steps for generating design shapes for two line level lithographic masks that can be employed for a design layout such as the exemplary design layout of FIG. 1. The two line level lithographic masks can include a first line level lithographic mask including a first pattern and a second line level lithographic mask including a second pattern. The union of the first pattern and the second pattern defines a complete pattern for the corresponding line level, which can be, for example, an M(x+1) line level. The intersection of the first pattern and the second pattern defines a complete pattern for via level structures to be formed between the M(x+1) line level line structures and the Mx line level line structures.

Referring to step 610, a design layout is provided, which includes design shapes representing various conductive structures to be formed in a target interconnect structure. This design layout functions as the input for the processing steps shown in FIG. 1, and is herein referred to as an initial design layout. Typical design layouts for metal interconnect structures as known in the art can be the initial design layout provided that the design layout includes design shapes for at least an M(x+1) line level, an Mx line level, and a Vx via level.

The various steps of the flow chart can be implemented by an apparatus including one or more processors in communication with a memory, i.e., a memory device. The one or more processors can be configured to run an automated program that includes instructions for implementing one, a plurality, or all of the steps of the first and second flow charts. One or more or all of the steps described below can be performed employing an apparatus including one or more processors in communication with a memory and configured to perform the corresponding step(s).

If an automated program that runs on an apparatus employing one or more processors is employed, the automated program can be configured to receive the design layout such as the exemplary design layout of FIG. 1.

The design layout includes at least a conductive line level, an underlying conductive line level, and a via design level. The conductive line level includes conductive-line-level design shapes that represent conductive line structures in a conductive line level in a target interconnect structure. The conductive line level is a line level that overlies at least another line level in an interconnect structure. The conductive line level is herein referred to as an M(x+1) line level, in which x is an integer that represents the order, from bottom to top, of the conductive line level within the interconnect structure. X can be any non-negative integer. In addition, if a local interconnect level including local interconnect structures as known in the art is employed underneath an M1 level, such a local interconnect level is herein referred to as an M0 level. If two local interconnect levels located at different levels are employed underneath an M1 level, a lower local interconnect level is herein referred to as an M(−1) level and an upper local interconnect level is herein referred to as an M0 level. The via design level can include design shapes representing the via structures that vertically connect the line structures in the M(x+1) line level and the line structures in the Mx line level, and is herein referred to as a Vx via level. In general, the design layout includes at least an overlying conductive line level, an underlying conductive line level, and a via level between the overlying metal line level and the underlying metal line level. For example, the overlying metal line level can be M(x+1) line level, the underlying metal line level can be Mx line level, and the via level can be Vx via level as known in the art.

The conductive-line-level design shapes include a plurality of decomposed design shapes having different colors that correspond to different lithographic masks. Each set of design shapes of the same color collectively provide a pattern for a lithographic mask. The collection of all sets of design shapes for the conductive-line-level design shapes collectively provide the entirety of the pattern for conductive line structures to be formed in the target interconnect structure. For example, the conductive-line-level design shapes can be M(x+1) line level design shapes. The M(x+1) line level design shapes can include M(x+1) line level design shapes having a first color and physically manifested as a first pattern in a first lithographic mask, and M(x+1) line level design shapes having a second color and physically manifested as a second pattern in a second lithographic mask. The M(x+1) line level design shapes having the first color are herein referred to as first color M(x+1) line level design shapes 140 (See FIG. 1), and the M(x+1) line level design shapes having the second color are herein referred to as second color M(x+1) line level design shapes 150 (See FIG. 1).

While the present disclosure is described employing two colors, variations of the present disclosure employing three or more colors for the conductive line level are expressly contemplated herein.

Each of the at least one underlying conductive line level includes underlying-conductive-line-level design shapes that represent underlying conductive line structures in an underlying conductive line level located underneath the conductive line level in the target interconnect structure. The underlying-conductive-line-level design shapes may have the same color (i.e., does not use mask decomposition techniques), or may include a plurality of decomposed design shapes having different colors that correspond to different lithographic masks (i.e., use mask decomposition techniques). The underlying-conductive-line-level design shapes can include electrically-active Mx line level design shape 120, and may optionally include one or more via-catching design shapes 122. The via design level includes via-level design shapes that represent via structures to vertically interconnect the conductive line structures and the underlying conductive line structures. Optionally, the initial design layout may include line-overlap-derived stitches 160' (See FIG. 1). While the initial design layout does not generally include via-derived stitches, embodiments are expressly contemplated in which the initial design layout includes some via level design shapes and some via-derived stitches that replace via level design shapes.

Referring to step 612, each stitch present in the M(x+1) line level of the initial design layout and each via level design shape in the Vx via level are identified and indexed. The stitches present in the M(x+1) line level of the initial design layout can be derived from the initial design layout by identifying all regions in which regions of different colors overlap within the M(x+1) line level design shapes. The stitches present in the M(x+1) line level of the initial design layout are the collection of all line-overlap-derived stitches 160' as illustrated in FIG. 1.

The entire stitch shapes present in the M(x+1) line level of the initial design layout and the entire via level design shapes present in the Vx via level of the initial design layout are herein collectively referred to as "target shapes" in the M(x+1) line level. During subsequent steps of the flow chart, the target shapes are analyzed by various programs to determine if changes are to be made thereupon or to other shapes. Specifically, the geometry of the target shapes and the relationship of the target shapes with respect to the design shapes in the underlying level are the basis for determining whether the target shapes or other design shapes are to be modified by an automated program. The target shapes in the M(x+1) line level are identified and indexed, for example, with natural numbers beginning with 1 and consecutively increasing by the increment of 1. In this case, the value of the index i that refers to each individual overlap shape in the M(x+1) line level can range from 1 to N, in which N is the total number of overlap shaped in the M(x+1) line level.

Referring to step 614, a parametrized value of the index i is set to 1, or the lowest number if the lower number is not 1.

Referring to step 615, an automated program is run to determine if the i-th target shape overlaps with any portion of via shapes in the Vx via level, i.e., the underlying via shapes as provided in the initial design layout. Since each target shape can be represented by a polygon, the determination on whether the i-th target shape overlaps with any portion of via shapes in the Vx via level can be made by checking whether a polygon representing the i-th target shape includes at least a portion of another polygon representing a via level design shape in the Vx via level. If the i-th target shape is a via level design shape in the Vx via level, an overlap with the i-th target shape and the set of all via shapes in the Vx via level exists naturally. The i-th design shape is not modified at this step.

If the i-th target shape overlaps a via level design shape in the Vx via level either as a via level design shape in the Vx via level or as a stitch in the M(x+1) level overlying a via level design shape, and the process flow proceeds to step 635 with optional modification to the i-th target shape.

If the i-th target shape does not overlap any via level design shape in the Vx via level, the i-th target shape is a line-overlap-derived stitch 160' that has been identified from the M(x+1) line level of the initial design layout at step 612. In this case, the process flow proceeds to step 625.

Referring to step 625, the initial design layout is checked to determine whether a via catch design shape 122 (See FIG. 1) is present in the initial design layout, or can be inserted in a modified design layout. Attempts for generating a via catch design shape 122 for the i-th target shape can be made, for example, by invoking an automated program that generates a new via catch design shape based on the geometry of the i-th target shape. Once a via catch design shape 122 is generated, the via catch design shape 122 is checked for design rule violations within the Mx line level, which may include limitations on the minimum spacing between the via catch design shape 122 and nearest Mx line level design shapes. Generation of a via catch design shape 122 that complies with the design rules may be possible, or may be impossible due to a preexisting Mx line level design shape. For example, the preexisting Mx line level design shape may overlap with the minimum required size for a via catch design shape 122, or may not be sufficiently spaced laterally from the smallest design shape that a via catch design shape 122 needs to include based on design rules. For example, the design rules for a via catch design shape 122 may require that the edges of a via catch design shape 122 be laterally offset outward from edges of the stitch, which is a line-overlap-derived stitch 160' (See FIG. 1).

In one embodiment, if generation of a via catch design shape 122 for the i-th target shape (which is a line-overlap-derived stitch 160') as generated from the initial design layout is not possible, the i-th target shape and the corresponding M(x+1) line level design shapes having different colors can be modified (without violating design rules for the M(x+1) line level) to determine whether a via catch design shape 122 complying with design rules for the Mx line level can be generated in a modified design layout for the modified i-th target shape.

For example, if a candidate via catch design shape violates a design rule for the Mx line level, i.e., the underlying conductive line level, another candidate via catch design shape can be generated by modification of the previous candidate via catch design shape. The automated program of step 625 checks whether the via catch design shape, which is a modified underlying conductive-line-level design shape, satisfies a set of design rules for the underlying conductive line level. If the candidate underlying conductive-line-level design shape is in violation of the set of design rules for the underlying conductive line level (i.e., the Mx line level), the candidate underlying conductive-line-level design shape can be further modified in a manner that enhances compliance of the candidate underlying conductive-line-level design shape to the set of design rules for the underlying conductive line level. The automated program of step 625 then determines if the modified candidate underlying conductive-line-level design shape can further be modified to be in full compliance with the set of design rules for the underlying conductive line level. If full compliance with the set of design rules for the underlying conductive line level is not achievable, the process flow proceeds to step 660.

If a via catch design shape 122 can be generated for the original or modified i-th target shape without violating a design rule, the process flow proceeds to step 630, and a corresponding via catch design shape 122 is generated and added to the modified design layout.

Referring to step 630, for the i-th target shape, which is a conductive-line-level design shape in the M(x+1) line level that does not overlap with via-level design shapes in the Vx via level and includes a stitch region in which decomposed design shapes of M(x+1) line level overlap, an automated program performs the task of determining whether a via-catching design shape can be inserted in the underlying conductive line level, i.e., in the Mx line level, while complying with the set of design rules for the underlying conductive line level. As discussed above, the set of design rules for the Mx line level can include prohibition of overlap of two design shapes in the Mx line level and separation of all design shapes in the Mx line level by at least a minimum separation distance.

Subsequently, the process flow proceeds to step 665, at which the value of the index i is compared with the maximum value of the index i. The maximum value of the index i can be the same as the total number of the target shapes if the target shapes are identified by consecutive natural numbers beginning with 1. Alternatively, any other indexing scheme that assigns a unique order to the entire set of target shapes can be employed.

If the value of the index i is at the maximum value at step 665, the design change is complete, and the process flow proceeds to step 680. The modified design layout at this processing step is output as a final design layout. The final design layout does not include any Vx via level design shapes. Thus, the Vx design level can be eliminated from the final design layout.

If the value of the index i is not at the maximum value at step 665, the process flow proceeds to step 670. At step 670, the value of the index i is incremented to the next value. For example, if the values of the index i are consecutive natural numbers beginning with 1, then the value of i can be incremented by 1. Then the process flow proceeds to step 615 with the incremented value for the index i.

Referring back to step 625, the automated program of step 625 is configured to determine whether a via catch design shape can be placed in the Mx line level without violation of design rules for the Mx line level. As discussed above, the automated program may employ a preexisting via catch design shape, if provided, with or without modification, or may employ a newly created via catching design shape if a preexisting via catch design shape is not present or not adequate. Further, the automated program may alter the i-th target shape as needed in order to find a solution for a via catch design shape that complies with the design rules. If the automated program of step 625 determines that it is not possible to place a via catch design shape in the Mx line level such that the via catch design shape in the Mx line level overlaps the i-th target shape in the M(x+1) line level and the via catch design shape in the Mx line level does not trigger a design rule violation in the Mx line level, the process flow proceeds to step 660. In other words, if insertion of a via-catching design shape in full compliance with the set of design rules is not achievable, the process flow proceeds to step 660.

Referring to step 660, the stitch corresponding to the i-th target shape is shifted to another nearby design shape in the M(x+1) line level. Another stitch region can be generated within a neighboring conductive-line-level design shape. This is because selection of areas for placing stitches can be heuristic, and nearby M(x+1) line level design shapes can be selected to move the original stitch in the i-th target shape, while the stitch corresponding to the i-th target shape can be eliminated. The corresponding decomposed design shapes are modified so that the i-th target shape is removed, while another stitch region is added. The new stitch region is added to the set of all target shapes as a new element, and the maximum number for the index value i is incremented by 1 (or by a suitable number if the increment between index values is not 1. Subsequently, the process flow proceeds to step 665.

Referring back to step 615, if the i-th target shape overlaps a via level design shape in the Vx via level either as a via level design shape in the Vx via level or as a stitch in the M(x+1) level overlying a via level design shape, and the process flow proceeds to step 635 with optional modification to the i-th target shape.

Referring to step 635, the automated program of step 635 determines whether the via level design shape corresponding to the i-th target shape can be replaced with the shape of a stitch in the M(x+1) line level. If the i-th target shape is a via level design shape, the automated program of step 635 determines whether a new stitch can be created within an overlying M(x+1) level design shape, or a preexisting stitch within the overlying M(x+1) level design shape can be moved, such that the periphery of the new stitch coincides with the periphery of the via level design shape which is the i-th target shape without violating the set of design rules for the M(x+1) line level. If a preexisting stitch is moved, the automated program determines whether the moved stitch can be modified to replicate the shape of the overlapping via level design shape. Checking for violation of design rules for the M(x+1) line level includes design rule checks as well as coloring conflict checks.

At each iteration of step 635, the automated program of step 635 checks, for an overlap area between the M(x+1) line level shape and the Vx via level shape that correspond to the i-th target shape, whether corresponding decomposed design shapes in the M(x+1) line level satisfies a set of design rules for the conductive line level of the M(x+1) line level. By running an automated program that performs the process flow of the flow chart of FIG. 16, the automated program can check, for each overlap area, whether corresponding decomposed design shapes satisfy a set of design rules for the conductive line level of the M(x+1) line level.

If a stitch can be created or a preexisting stitch can be moved within the overlying M(x+1) level design shape such that the periphery of the new stitch coincides with the periphery of the via level design shape (i.e., the i-th target shape) without violating the set of design rules for the M(x+1) line level, the process flow proceeds to step 640 and the design layout is modified to create a stitch within the corresponding M(x+1) level design shape.

Specifically, the i-th target shape is a conductive-line-level design shape that is derived from the M(x+1) line level design shapes, and overlaps a via-level design shape selected from the entire set of via-level design shapes. Decomposed design shapes corresponding to the conductive-line-level design shape are modified at step 640 such that a via overlap region in which the conductive-line-level design shape overlaps with the via-level design shape is transformed into a stitch region in which at least two decomposed design shapes overlap. The modification of the decomposed design shapes corresponding to the i-th target shape can be performed by running an automated program on a computer configured to run the automated program. The design layout is modified at each iteration of step 640 such that each via overlap region in which the corresponding conductive-line-level design shape overlaps with the corresponding via-level design shape is transformed into a stitch region in which two (or more) decomposed design shapes overlap. In this case, a periphery of each stitch generated at an iteration of step 640 coincides with a periphery of a corresponding via overlap region, which is the periphery of the i-th target shape as suitably modified as needed. Subsequently, the process flow proceeds to step 665.

If the automated program of step 635 determines that creation or move of a stitch to induce the periphery of the new or moved stitch to coincide with the periphery of the via level design shape without violating the set of design rules for the M(x+1) line level is not possible, then at least one of the corresponding decomposed design shapes for the i-th target shape is in violation of a set of design rules for the M(x+1) line level. In this case, the shape of the stitch region can be modified in a manner that enhances compliance of the corresponding decomposed design shapes to the set of design rules for the M(x+1) line level. Then, the process flow proceeds to step 645.

The automated program of step 645 determines whether the shape of the i-th target shape, i.e., the overlapping via level design shape, may be moved, and/or modified, so that the shape of the i-th target shape coincides with the shape of the modified and/or moved overlapping via level design shape. Move and/or modifications to the overlying M(x+1) level design shape overlapping with the i-th target shape may be performed in conjunction with the move and/or modification of the i-th target shape.

If the automated program of step 645 determines that a stitch can be created or a preexisting stitch can be moved within the overlying M(x+1) level design shape in conjunction with moving or modification of the i-th target shape such that the periphery of the new stitch coincides with the periphery of the i-th target shape without violating the set of design rules for the M(x+1) line level, an underlying-conductive-line-level design shape is compared with the modified i-th target shape to determine if the underlying-conductive-line-level design shape (Mx line level design shape) is in compliance with the design rules for the Mx level under the assumption that the i-th target shape, as modified, is considered as a via level design shape. The underlying-conductive-line-level design shape in this case is a via-catching design shape 122 illustrated in FIG. 1. If the underlying-conductive-line-level design shape is in compliance with the design rules for the Mx level under the assumption that the i-th target shape, as modified, is considered as a via level design shape, the process flow proceeds to step 665.

If the underlying-conductive-line-level design shape (Mx line level design shape) is not in compliance with the design rules for the Mx level under the assumption that the i-th target shape, as modified, is considered as a via level design shape, this means that the modifications performed at step 645 induces violation of a design rule for the Mx line level. If the automated program of step 645 determines that creation or move of a stitch to induce the periphery of the new or moved stitch to coincide with the periphery of the via level design shape without violating the set of design rules for the M(x+1) line level and without violating the set of design rules for the Mx level is not possible even in conjunction with move and/or modifications to the i-th target shape and/or modifications to the underlying-conductive-line-level design shape, the process flow proceeds to step 655.

The automated program of step 655 determines whether the shape of the i-th target shape, i.e., the overlapping via level design shape, may be moved, and/or modified, so that the shape of the i-th target shape coincides with the shape of the modified and/or moved overlapping via level design shape without violation of the design rules for the M(x+1) line level and while avoiding violation of the design rules for the Mx line level through modifications to the underlying-conductive-line-level design shape that overlaps with the modified i-th test shape. Move and/or modifications to the overlying M(x+1) level design shape overlapping with the i-th target shape may be performed in conjunction with the move and/or modification of the i-th target shape.

If the automated program of step 655 determines that a stitch can be created or a preexisting stitch can be moved within the overlying M(x+1) level design shape in conjunction with moving or modification of the i-th target shape such that the periphery of the new stitch coincides with the periphery of the i-th target shape without violating the set of design rules for the M(x+1) line level and a corresponding underlying-conductive-line-level design shape can be modified to be in compliance with the design rules for the Mx level under the assumption that the i-th target shape, as modified, is considered as a via level design shape, then a necessary modification is made to the underlying-conductive-line-level design shape. The shape of the stitch region, corresponding to the modified shape of the i-th target shape as generated at step 655, is within the area of the underlying-conductive-line-level design shape. The underlying-conductive-line-level design shape in this case is a via-catching design shape 122 illustrated in FIG. 1. In this case, the process flow proceeds to step 640 and the design layout is modified to create a stitch within the corresponding M(x+1) level design shape. The i-th target shape can be deleted from the Vx via level in the modified design layout.

The automated program of step 655 checks whether the modified underlying conductive-line-level design shape generated to function as a via-catching design shape for the i-th test shape (as modified at step 655) satisfies the set of design rules for the underlying conductive line level, i.e., the Mx line level. If the modified underlying conductive-line-level design shape is in violation of the set of design rules for the Mx line level, the underlying conductive-line-level design shape can be modified in a manner that enhances compliance of the modified underlying conductive-line-level design shape to the set of design rules for the Mx line level.

The automated program of step 655 determines if the underlying conductive-line-level design shape overlapping with the i-th test shape can be modified to be in full compliance with the set of design rules for the Mx line level. If the underlying conductive-line-level design shape overlapping with the i-th test shape cannot be modified to be in full compliance with the set of design rules for the Mx line level, the process flow proceeds to step 660. Further, if the automated program of step 655 determines that a stitch cannot be created and a preexisting stitch, if any, cannot be moved within the overlying M(x+1) level design shape, even in conjunction with moving or modification of the i-th target shape, such that the periphery of the new stitch coincides with the periphery of the i-th target shape without violating the set of design rules for the M(x+1) line level, the process flow proceeds to step 660.

The process flow of the flow chart of FIG. 16 is performed until all target shapes are analyzed, including the additional target shapes that are newly generated at step 660. By iteratively running the process steps of the flow chart of FIG. 16, a plurality of decomposed design shapes are modified such that a corresponding stitch region is generated for each via-level design shape within the via design level at an iteration of step 640. Each generated design shape for stitch regions is in compliance with the set of design rules for the via design level, i.e., the Vx via level. Upon completion of the process flow of the flow chart of FIG. 16, each via-level design shape in the Vx via level can be replaced with a corresponding stitch region in the M(x+1) line level. In this case, the Vx via level can be eliminated, i.e., deleted, from the final design layout generated at step 680.

Figure 17:
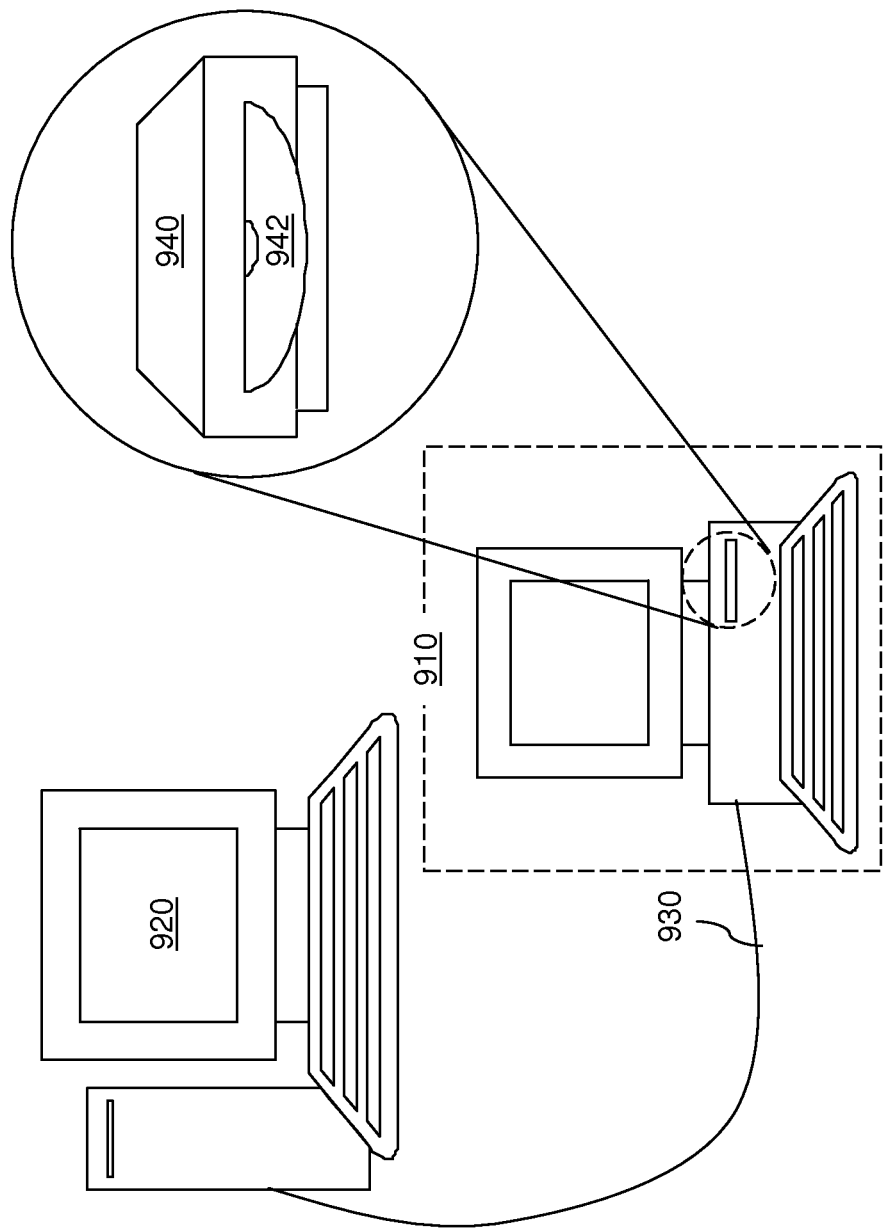
FIG. 17 illustrates an exemplary apparatus that can be employed to implement the methods of various embodiments of the present disclosure.

Referring to FIG. 17, an exemplary apparatus is illustrated, which can be employed to implement the methods of various embodiments of the present disclosure. The apparatus can be configured to perform at least one and/or any of the steps in the first or second flow charts in one or more automated steps by running an automated program on any computing means known in the art. The apparatus can be employed to decompose design shapes in a design level into a plurality of target design levels. The apparatus includes one or more processors in communication with a memory and is configured to run an automated program.

The automated program can include any or all of the steps of the first and/or second flow charts. In one embodiment, the apparatus can include at least one computing means 910 including one or more processor units that are in communication with a memory. The at least one computing means 910 can include a computer as known in the art. The at least one computing means 910 can be in communication with a database 920, which can be a standalone computing means or can be incorporated into the at least one computing means 910. The database can store all or a subset of the design shapes for the design levels provided at step 610 or generated at later processing steps. If the database 920 is a standalone computing means, a data cable 930 or wireless communication can be employed to transfer data between the database 920 and the at least one computing means 910. The database can store information on process assumptions, and any or all of predefined parameters to be employed while the automated program runs.

The at least one computing means 910 can be employed to perform at least one or all of the steps described above with, or without, human intervention depending on the program that runs thereupon. The input data and the output data (e.g., the design for a pupil filter according to various embodiments of the present disclosure) can be stored in at least one non-transitory machine-readable data storage medium that can be provided within the at least one computing means 910 and/or within at least one non-transitory machine-readable data storage medium provided within the database 920. The non-transitory machine-readable data storage medium may be of any type known in the art.

One or more non-transitory machine readable medium within the at least one computing means 910 and/or the database 920 can be a portable non-transitory machine-readable data storage medium 942 such as a CD ROM or a DVD ROM. A data-writing device 940 may be provided in the at least one computing means 910 or within the database 920 to enable encoding of the data representing any of the data employed during the various steps in the first and/or second flow chart(s).

The design data can include the various design shapes for the design level as originally provided, and for each and/or all of the various mask level design layouts of the present disclosure. The design data for the mask level design layouts of the present disclosure can be transferred to a manufacturing facility that can manufacture a set of lithographic masks corresponding to the design shapes for the mask level design layouts. The data transfer to the mask writing device can be effected by a portable non-transitory machine-readable data storage medium 942, a data cable (not shown) or by wireless communication.

In one embodiment, the various data employed in the method of the present disclosure, including the design layout, the annotated design layout, any intermediate structure files, and the final structure file, can be in any data format used for the exchange of layout data of integrated circuits and/or symbolic data format (e.g. information stored in a GDSII (GDS2), GL1, OASIS, map files, or any other suitable format for storing such design data structures). The various data may comprise information such as, for example, symbolic data, map files, test data files, design content files, layout parameters, and any other data required by a reticle manufacturer to manufacture a set of at least one reticle encoding the third modified chip design layout.

A machine-readable medium embodying the design data for the mask level design layouts of the present disclosure can have the functionality of generating a representation, in a format perceptible by humans or recognizable by an automated machine (such as an optical character reader or a program configured to recognize graphics data), of a semiconductor structure, a semiconductor device, a semiconductor circuit, or any other physical implementation of the devices and structures of the present disclosure. The design data for the mask level design layouts of the present disclosure, as embodied in the machine-readable medium, can be organized such that the inherent physical or logical relationship among data elements can be represented in a temporary or permanent display device such as a computer monitor or at least one printed sheet of paper. Further, the design data for the mask level design layouts of the present disclosure can be designed to support specific data manipulation functions, including, but not limited to, editing, adding, subtracting, or otherwise modifying or modulating the various data elements within the design data for the mask level design layouts. In addition, the design data for the mask level design layouts of the present disclosure can be configured to cause the representation in the format perceptible by humans or recognizable by an automated machine to include various display elements (e.g., line, curves, symbols, areas, volumes, etc.) that correspond to each of the various data elements within the design data for the mask level design layouts. The design data for the mask level design layouts of the present disclosure can be a functional descriptive material as recorded on the machine-readable medium, and as such, can become structurally and functionally interrelated to the machine-readable medium so as to change the format and organization of the various memory elements within the machine-readable medium and confer a functionality of generating at least one visual representation when read by a display program, which can be a visual display program or a printing program, and can reside in a computing device, or can be encoded within the same machine-readable medium, or can be encoded within a different machine-readable medium that can be read by the same computing device that reads the machine-readable medium encoding the design data for the mask level design layouts of the present disclosure.

In one embodiment, a machine-readable medium embodying the design data for the mask level design layouts of the present disclosure can additionally encode a computer program that enables the generation of a representation, in a format perceptible by humans or recognizable by an automated machine. In one embodiment, the computer program that enables the generation of a representation, in a format perceptible by humans or recognizable by an automated machine can reside in a computing device or in another machine-readable medium that can be read by a computing device configured to read the machine-readable medium embodying the design data for the mask level design layouts of the present disclosure.

Upon running of the computer program on the design data for the mask level design layouts of the present disclosure, a representation of the design data for the t mask level design layouts can be generated in a format perceptible by humans or recognizable by an automated machine, which can be employed to design, manufacture, and/or to test any of a semiconductor structure, a semiconductor device, a semiconductor circuit, or any other physical implementation of the devices, structures and/or circuits of the present disclosure as embodied in the design data for the mask level design layouts. Alternately or additionally, a representation of the design data for the mask level design layouts as generated in a format perceptible by humans or recognizable by an automated machine can be employed to design, manufacture, and/or to test any design for a semiconductor structure, a semiconductor device, a semiconductor circuit, or any other physical implementation of the devices and structures of the present disclosure as embodied in the design data for the mask level design layouts.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A method for generating shapes for a design layout, said method comprising:
   providing a design layout including a conductive line level, an underlying conductive line level, and a via design level, said conductive line level including conductive-line-level design shapes that represent conductive line structures in a conductive line level in a target interconnect structure, said underlying conductive line level including underlying-conductive-line-level design shapes that represent underlying conductive line structures in an underlying conductive line level located underneath said conductive line level in said target interconnect structure, and said via design level including via-level design shapes that represent via structures that vertically interconnect said conductive line structures and said underlying conductive line structures, wherein said conductive-line-level design shapes include a plurality of decomposed design shapes having different colors, wherein each color corresponds to a different lithographic mask; and
   modifying, for a conductive-line-level design shape that overlaps with said via-level design shapes, decomposed design shapes corresponding to said conductive-line-level design shape such that each via overlap region in which said conductive-line-level design shape overlaps with said via-level design shapes is transformed into a stitch region in which two decomposed design shapes overlap by running an automated program on a computer configured to run said automated program.

2. The method of claim 1, wherein a periphery of said stitch coincides with a periphery of a corresponding via overlap region.

3. The method of claim 2, further comprising:
   checking, for each overlap area, whether corresponding decomposed design shapes satisfy a set of design rules for said conductive line level; and
   modifying, if any of said corresponding decomposed design shapes is in violation of said set of design rules, a shape of said stitch region in a manner that enhances compliance of said corresponding decomposed design shapes to said set of design rules.

4. The method of claim 3, further comprising modifying an underlying-conductive-line-level design shape among said underlying-conductive-line-level design shapes such that said modified shape of said stitch region is within an area of said underlying-conductive-line-level design shape.

5. The method of claim 4, further comprising:
   checking whether said modified underlying conductive-line-level design shape satisfies a second set of design rules for said underlying conductive line level; and further modifying, if said modified underlying conductive-line-level design shape is in violation of said second set of design rules, said modified underlying conductive-line-level design shape in a manner that enhances compliance of said modified underlying conductive-line-level design shape to said second set of design rules.

6. The method of claim 5, further comprising:
determining if said modified underlying conductive-line-level design shape can further be modified to be in full compliance with said second set of design rules; and
if full compliance with said second set of design rules is not achievable, generating another stitch region within a neighboring conductive-line-level design shape.

7. The method of claim 1, further comprising, for another conductive-line-level design shape that does not overlap with said via-level design shapes and including another stitch region in which additional decomposed design shapes overlap, determining whether a via-catching design shape can be inserted in said underlying conductive line level while complying with a set of design rules for said underlying conductive line level.

8. The method of claim 7, if insertion of said via-catching design shape in full compliance with said set of design rules is not achievable, generating another stitch region within a neighboring conductive-line-level design shape and modifying said additional decomposed design shapes so that said another stitch region is deleted.

9. The method of claim 1, further comprising modifying said plurality of decomposed design shapes such that a corresponding stitch region is generated for each via-level design shape within said via design level.

10. The method of claim 1, wherein each generated design shape for stitch regions is in compliance with a set of design rules for said via design level.

11. A method of forming a metal interconnect structure, said method comprising:
forming a dielectric material layer and a stack of hard mask layers over an underlying dielectric material layer embedding underlying conductive line structures, said stack of hard mask layers comprising at least, from bottom to top, a first dielectric hard mask layer including a first dielectric material, a second dielectric hard mask layer including a second dielectric material, a metallic hard mask layer including a metallic material, and a third dielectric hard mask layer including a third dielectric material;
recessing a first portion of said third dielectric hard mask layer and said metallic hard mask layer within an area of a first pattern employing a combination of a first lithographic process and a first etch;
recessing a second portion of said third dielectric hard mask layer and said metallic hard mask layer within an area of a second pattern employing a combination of a second lithographic process and a second etch, wherein a cavity is formed within an area of intersection between said first pattern and said second pattern, said cavity having a bottom surface below a first horizontal plane including a bottom surface of said second dielectric hard mask layer and above a second horizontal plane including a top surface of said dielectric material layer; and
forming a continuous recessed space including a line trench and a via cavity by further recessing regions of said first and second pattern, wherein said via cavity is formed within an area of one of said underlying conductive line structures.

12. The method of claim 11, further comprising recessing said having said bottom surface of said cavity below said second horizontal plane, while recessed surfaces outside of said cavity are recessed to a height between said first horizontal plane and said second horizontal plane.

13. The method of claim 11, wherein said stack of hard mask layers further includes another metallic hard mask layer that is formed between said first dielectric hard mask layer and said second dielectric hard mask layer, and said bottom surface of said cavity is a recessed surface of said another metallic hard mask layer.

14. The method of claim 13, wherein bottom surfaces of recessed regions outside of said cavity are recessed surfaces of said metallic hard mask layer.

15. The method of claim 11, a top surface of said one of said underlying conductive line structures is physically exposed at a bottom of said via cavity after formation of said continuous recessed space.

16. An apparatus for generating shapes for a design layout, said apparatus comprising a particularly programmed computer including one or more processors in communication with a memory and configured to run an automated program, said automated program including:
a step of receiving a design layout including a conductive line level, an underlying conductive line level, and a via design level, said conductive line level including conductive-line-level design shapes that represent conductive line structures in a conductive line level in a target interconnect structure, said underlying conductive line level including underlying-conductive-line-level design shapes that represent underlying conductive line structures in an underlying conductive line level located underneath said conductive line level in said target interconnect structure, and said via design level including via-level design shapes that represent via structures that vertically interconnect said conductive line structures and said underlying conductive line structures, wherein said conductive-line-level design shapes include a plurality of decomposed design shapes having different colors, wherein each color corresponds to a different lithographic mask; and
a step of modifying, for a conductive-line-level design shape that overlaps with said via-level design shapes, decomposed design shapes corresponding to said conductive-line-level design shape such that each via overlap region in which said conductive-line-level design shape overlaps with said via-level design shapes is transformed into a stitch region in which two decomposed design shapes overlap.

17. The apparatus of claim 16, wherein a periphery of said stitch coincides with a periphery of a corresponding via overlap region.

18. The apparatus of claim 17, further comprising:
a step of checking, for each overlap area, whether corresponding decomposed design shapes satisfy a set of design rules for said conductive line level; and
a step of modifying, if any of said corresponding decomposed design shapes is in violation of said set of design rules, a shape of said stitch region in a manner that enhances compliance of said corresponding decomposed design shapes to said set of design rules.

19. The apparatus of claim 18, further comprising a step of modifying an underlying-conductive-line-level design shape among said underlying-conductive-line-level design shapes such that said modified shape of said stitch region is within an area of said underlying-conductive-line-level design shape.

20. The apparatus of claim 19, further comprising:
a step of checking whether said modified underlying conductive-line-level design shape satisfies a second set of design rules for said underlying conductive line level; and
further modifying, if said modified underlying conductive-line-level design shape is in violation of said second set of design rules, said modified underlying conductive-line-level design shape in a manner that enhances compliance of said modified underlying conductive-line-level design shape to said second set of design rules.

* * * * *